US012557336B2

(12) United States Patent
Nishimura et al.

(10) Patent No.: US 12,557,336 B2
(45) Date of Patent: Feb. 17, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventors: Tomoya Nishimura, Tokyo (JP); Atsushi Sakai, Tokyo (JP); Katsumi Eikyu, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 399 days.

(21) Appl. No.: 18/353,250

(22) Filed: Jul. 17, 2023

(65) Prior Publication Data

US 2024/0113218 A1 Apr. 4, 2024

(30) Foreign Application Priority Data

Sep. 22, 2022 (JP) ................................. 2022-151945

(51) Int. Cl.
*H10D 30/66* (2025.01)
*H10D 30/01* (2025.01)
*H10D 64/00* (2025.01)
*H10D 64/01* (2025.01)

(52) U.S. Cl.
CPC ....... *H10D 30/668* (2025.01); *H10D 30/0297* (2025.01); *H10D 64/01* (2025.01); *H10D 64/112* (2025.01); *H10D 64/117* (2025.01)

(58) Field of Classification Search
CPC .. H10D 30/668; H10D 30/0297; H10D 64/01; H10D 64/117; H10D 64/112
USPC ......................................................... 257/330
See application file for complete search history.

(56) References Cited

U.S. PATENT DOCUMENTS

| | | | | |
|---|---|---|---|---|
| 2018/0315812 | A1* | 11/2018 | Yedinak | H10D 62/103 |
| 2018/0350910 | A1* | 12/2018 | Saito | H10D 62/405 |
| 2023/0178646 | A1* | 6/2023 | Nagahama | H10D 64/112 |
| | | | | 257/330 |

OTHER PUBLICATIONS

Tanuj Saxena et al., "Floating Body Ring Termination for Trench Field Plate Power MOSFETs" International Symposium on Power Semiconductor Devices and ICs (ISPSD), Sep. 13-18, 2020, Vienna, Austria, pp. 439-442.

* cited by examiner

*Primary Examiner* — Igwe U Anya
(74) *Attorney, Agent, or Firm* — Rimon P.C.

(57) ABSTRACT

A first trench extending in a Y direction is formed in each of a semiconductor substrate located in a cell region and the semiconductor substrate located in an outer peripheral region. A second trench is formed in the semiconductor substrate in the outer peripheral region so as to surround the cell region in a plan view. A p-type body region is formed in the semiconductor substrate in each region. A plurality of p-type floating regions is formed in the semiconductor substrate in the outer peripheral region. A field plate electrode is formed at a lower portion of each of the first trench and the second trench. A gate electrode is formed at an upper portion of the first trench located in the cell region. A floating gate electrode is formed at an upper portion of each of the first trench located in the outer peripheral region and the second trench.

17 Claims, 42 Drawing Sheets

A-A CROSS-SECTION

B-B CROSS-SECTION

C-C CROSS-SECTION

D-D CROSS-SECTION

<EXAMINED EXAMPLE 1>

<EXAMINED EXAMPLE 2>

A'-A' CROSS-SECTION
<EXAMINED EXAMPLE 1>

A-A CROSS-SECTION

A-A CROSS-SECTION

A-A CROSS-SECTION

A-A CROSS-SECTION

A-A CROSS-SECTION

A-A CROSS-SECTION

A-A CROSS-SECTION

A-A CROSS-SECTION

A-A CROSS-SECTION

A-A CROSS-SECTION

A-A CROSS-SECTION

A-A CROSS-SECTION

A-A CROSS-SECTION

A-A CROSS-SECTION

A-A CROSS-SECTION

A-A CROSS-SECTION

A-A CROSS-SECTION

A-A CROSS-SECTION

SEMICONDUCTOR DEVICE AND METHOD OF MANUFACTURING THE SAME

CROSS-REFERENCE TO RELATED APPLICATIONS

The disclosure of Japanese Patent Application No. 2022-151945 filed on Sep. 22, 2022, including the specification, drawings and abstract is incorporated herein by reference in its entirety.

BACKGROUND

The present disclosure relates to a semiconductor device and a method of manufacturing the same, and more particularly, to a semiconductor device and a method of manufacturing the same including a gate electrode and a field plate electrode inside a trench.

In a semiconductor device including a semiconductor element such as a power MOSFET (Metal Oxide Semiconductor Field Effect Transistor), a trench gate structure in which a gate electrode is embedded in a trench is applied. One type of trench gate structures is a split gate structure in which a field plate electrode is formed at a lower portion of a trench and a gate electrode is formed at an upper portion of the trench. A potential which is the same as a potential supplied to the source electrode is to be supplied to the field plate electrode. By expanding a depletion layer in a drift region by using the field plate electrode, it is possible to increase the concentration of the drift region, and it is possible to reduce the resistance of the drift region.

Also, in a semiconductor device having a cell region in which a power MOSFET is formed, a breakdown voltage of an outer peripheral region is improved by devising a structure of an impurity region formed in a semiconductor substrate of the outer peripheral region surrounding the cell region.

Here, there are disclosed techniques listed below.
[Non-Patent Literature 1] Tanuj SAxena, Vishnu Khemka, Bernhand Grote, Ganming Qin and Moaniss Zitouni "Floating Body Ring Termination for Trench Field Plate Power MOSFETs" International Symposium on Power Semiconductor Devices and Ics (ISPSD), Sep. 13-18, 2020, Vienna, Austria, pp. 439-442.

For example, Non-Patent Literature 1 discloses a technique for improving the breakdown voltage of the outer peripheral region by forming a p-type impurity region called a FBR (Floating Body Ring) structure in the semiconductor substrate of the outer peripheral region.

SUMMARY

In the outer peripheral region, a termination trench is formed so as to surround the cell region, and the field plate electrode is formed inside the termination trench. Between the trench in the cell region and the termination trench, a body region to be served as a channel region of a MOSFET is formed from the cell region to the outer peripheral region. However, when the distance between the trench of the cell region and the termination trench is longer than the optimum value, the depletion layer generated from the body region located at this position is not sufficiently and deeply expanded, thereby the electric field strength is to be high, and the breakdown voltage becomes lower.

For this problem, although the FBR structure such as Non-Patent Literature 1 is effective, the inventors of the present application have found that the effect of the FBR structure is not sufficiently exhibited due to the capacitive coupling between the p-type impurity region and the field plate electrode and the capacitive coupling between the p-type impurity region and a gate wiring. Therefore, since the reduction of the breakdown voltage in the outer peripheral region cannot be sufficiently suppressed, the reliability of the semiconductor device becomes lower.

Other objects and novel features will become apparent from the description of this specification and the accompanying drawings.

The typical ones of the embodiments disclosed in the present application will be briefly described as follows.

A semiconductor device according to one embodiment, including: a cell region in which a MOSFET is formed; and an outer peripheral region surrounding the cell region in plan view. Also, the semiconductor device includes: a semiconductor substrate of a first conductivity type, the semiconductor substrate having an upper surface and a lower surface; a first trench extending in a first direction in plan view, and formed in each of the semiconductor substrate located in the cell region and the semiconductor substrate located in the outer peripheral region; a first field plate electrode formed inside the first trench at a lower portion of the first trench, in each of the cell region and the outer peripheral region; a gate electrode formed inside the first trench at an upper portion of the first trench, in each of the cell region and a first portion of the outer peripheral region; a second trench extending in each of the first direction and a second direction perpendicular to the first direction in plan view so as to surround the cell region in plan view, and formed in the semiconductor substrate located in the outer peripheral region; a body region of a second conductivity type opposite the first conductivity type, the body region being formed in each of the semiconductor substrate located in the cell region and the semiconductor substrate located in a second portion of the outer peripheral region; a source region of the first conductivity type, the source region being formed in the body region located in the cell region; and
a first floating region of the second conductivity type, the first floating region being formed in the semiconductor substrate located in the outer peripheral region. Here, a depth of each of the body region and the first floating region is shallower than a depth of each of the first trench and the second trench. Also, the first floating region is located between the first trench located in the outer peripheral region and the second trench extending in the second direction such that the first floating region is spaced apart from the body region. Also, in a third portion of the outer peripheral region, a first floating gate electrode is formed inside the first trench at the upper portion of the first trench. Also, a second field plate electrode is formed inside the second trench at a lower portion of the second trench. Also, a second floating gate electrode is formed inside the second trench at an upper portion of the second trench. Also, in the first trench, the gate electrode, the first field plate electrode and the first floating gate electrode are insulated from one another. Further, in the second trench, the second field plate electrode and the second floating gate electrode are insulated from each other.

A method of manufacturing a semiconductor device according to one embodiment, including: a cell region in which a MOSFET is formed; and an outer peripheral region surrounding the cell region in plan view. Also, the method includes steps of: (a) providing a semiconductor substrate of a first conductivity type, the semiconductor substrate having an upper surface and a lower surface; (b) after the step of (a), forming a first trench in each of the semiconductor substrate located in the cell region and the semiconductor substrate located in the outer peripheral region, and forming a second trench in the semiconductor substrate located in the outer peripheral region, the first trench extending in a first direction in plan view, and the second trench extending in each of the first direction and a second direction perpendicular to the first direction in plan view so as to surround the cell region in plan view; (c) after the step of (b), forming a first field plate electrode such that an inside of the first trench is embedded with the first filed plate electrode, and forming a second field plate electrode such that an inside of the second trench is embedded with the second filed plate electrode; (d) after the step of (c), selectively retracting an another portion of the first field plate electrode such that a one portion of the first field plate electrode is left as a first contact portion, and selectively retracting an another portion of the second field plate electrode such that a one portion of the second field plate electrode is left as a second contact portion; (e) after the step of (d), forming a gate electrode on the first field plate electrode located in each of the cell region and a first portion of the outer peripheral region such that the inside of the first trench is embedded with the gate electrode, forming a first floating gate electrode on the first field plate electrode located in a third portion of the outer peripheral region such that the inside of the first trench is embedded with the first floating gate electrode, and forming a second floating gate electrode on the second field plate electrode such that the inside of the second trench is embedded with the second floating gate electrode; (f) after the step of (e), forming a body region in each of the semiconductor substrate located in the cell region and the semiconductor substrate located in a second portion of the outer peripheral region, and forming a first floating region in the semiconductor substrate located in the outer peripheral region, the body region being a region of a second conductivity type opposite the first conductivity type, the first floating region being a region of the second conductivity type; and (g) after the step of (f), forming a source region in the body region located in the cell region, the source region being a region of the first conductivity type. Here, a depth of each of the body region and the first floating region is shallower than a depth of each of the first trench and the second trench. Also, the first floating region is located between the first trench located in the outer peripheral region and the second trench extending in the second direction such that the first floating region is spaced apart from the body region. Also, in the first trench, the gate electrode, the first field plate electrode and the first floating gate electrode are insulated from one another. Further, in the second trench, the second field plate electrode and the second floating gate electrode are insulated from each other.

A semiconductor device according to one embodiment including: a cell region in which a MOSFET is formed; and an outer peripheral region surrounding the cell region in plan view. Also, the semiconductor device includes: a semiconductor substrate of a first conductivity type, the semiconductor substrate having an upper surface and a lower surface; a first trench extending in a first direction in plan view, and formed in each of the semiconductor substrate located in the cell region and the semiconductor substrate located in the outer peripheral region; a first field plate electrode formed inside the first trench at a lower portion of the first trench, in each of the cell region and the outer peripheral region; a gate electrode formed inside the first trench at an upper portion of the first trench, in each of the cell region and a first portion of the outer peripheral region; a second trench extending in each of the first direction and a second direction perpendicular to the first direction in plan view so as to surround the cell region in plan view, and formed in the semiconductor substrate located in the outer peripheral region; a body region of a second conductivity type opposite the first conductivity type, the body region being formed in each of the semiconductor substrate located in the cell region and the semiconductor substrate located in a second portion of the outer peripheral region; a source region of the first conductivity type, the source region being formed in the body region located in the cell region; and a first floating region of the second conductivity type, the first floating region being formed in the semiconductor substrate located in the outer peripheral region. Here, a depth of each of the body region and the first floating region is shallower than a depth of each of the first trench and the second trench. Also, the first floating region is located between the first trench located in the outer peripheral region and the second trench extending in the second direction such that the first floating region is spaced apart from the body region. Also, in a third portion of the outer peripheral portion, the upper portion of the first trench is embedded with a first insulating film. Also, a second field plate electrode is formed inside the second trench at a lower portion of the second trench. Also, an upper portion of the second trench is embedded with a second insulating film. Also, the semiconductor substrate, the gate electrode and the first field plate electrode are insulated from one another. Further, the semiconductor substrate and the second field plate electrode are insulated from each other.

According to an embodiment, the reliability of semiconductor device can be improved.

DETAILED DESCRIPTION

Figure 1:
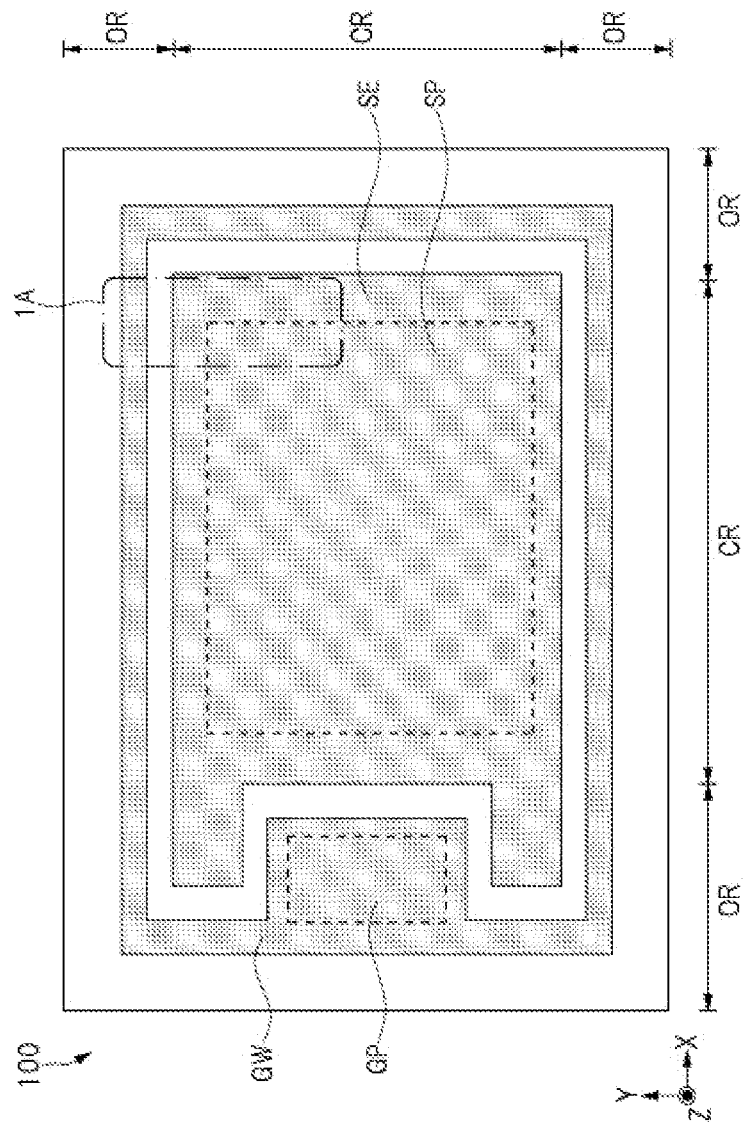
FIG. 1 is a plan view showing a semiconductor device according to a first embodiment.

Embodiments will be explained below in detail on the basis of drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In addition, the X direction, the Y direction, and the Z direction described in the present application intersect each other and are orthogonal to each other. In the present application, the Z direction be referred to as Vertical direction, height direction or of a certain structure. In addition, the expression "plan view" or "planar view" used in the present application means that the plane formed by the X direction and the Y direction is a "plane", and the "plane" is viewed from the Z direction.

First Embodiment

<Structure of Semiconductor Device>

Figure 2:
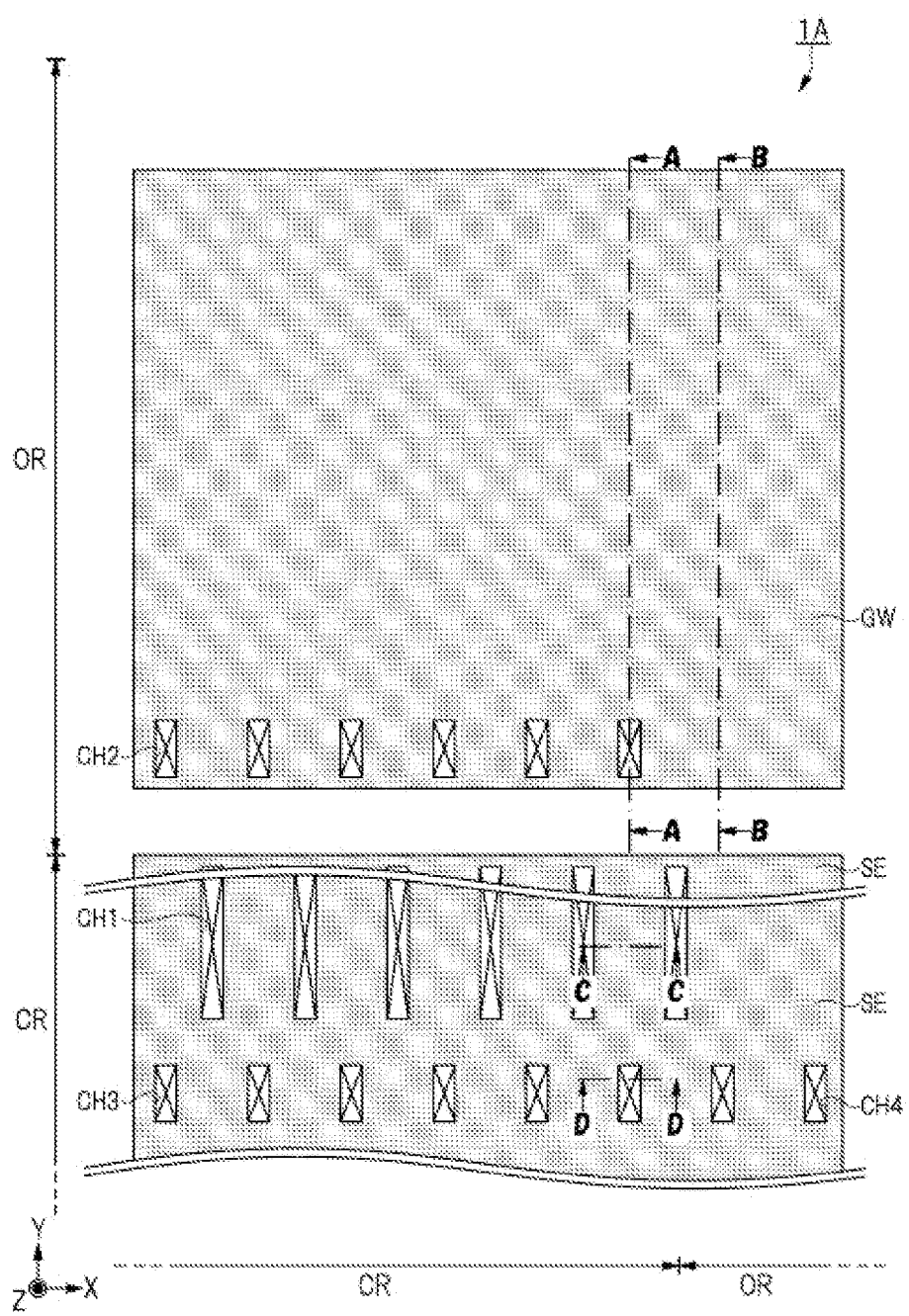
FIG. 2 is an enlarged plan view showing a main portion of the semiconductor device according to the first embodiment.
Figure 3:
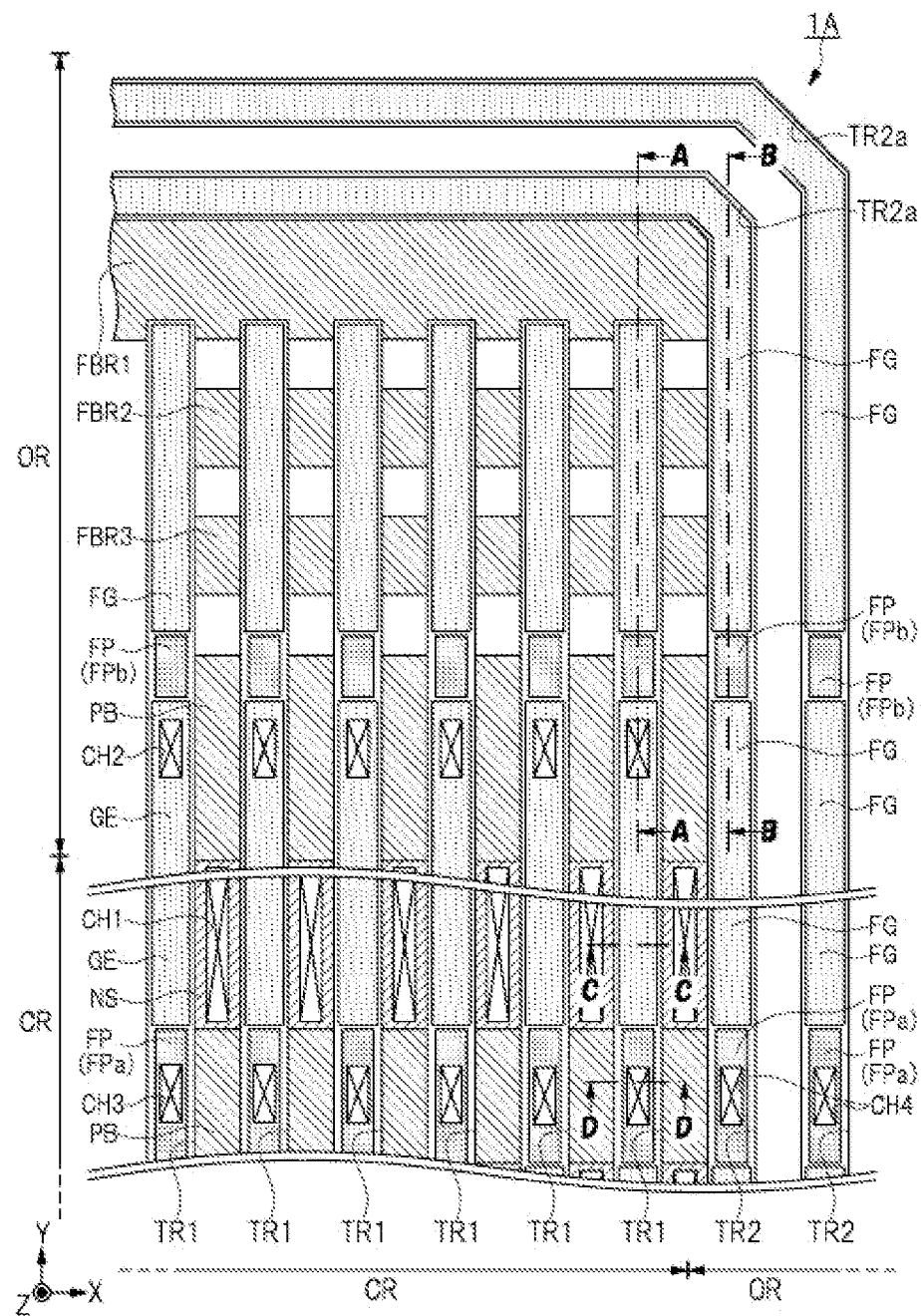
FIG. 3 is an enlarged plan view showing the main portion of the semiconductor device according to the first embodiment.
Figure 4:
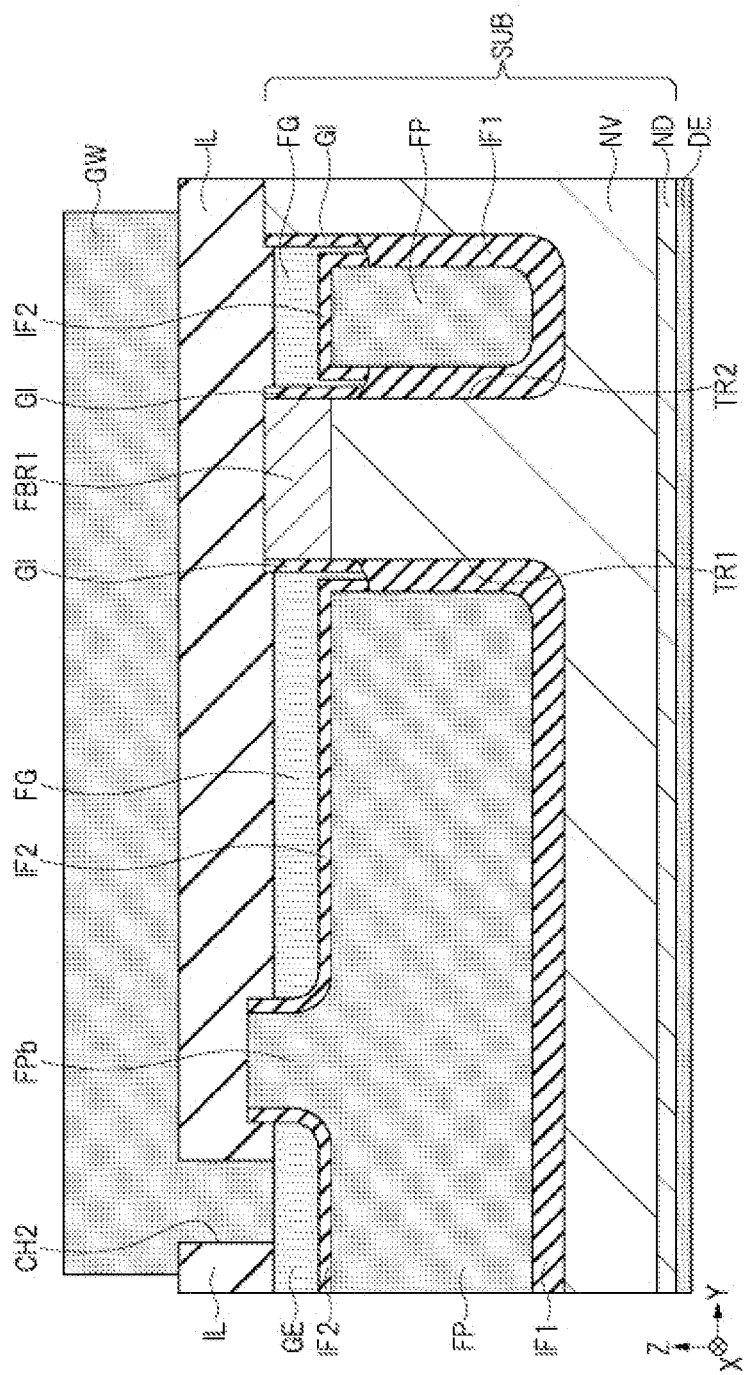
FIG. 4 is a cross-sectional view showing the semiconductor device according to the first embodiment.
Figure 5:
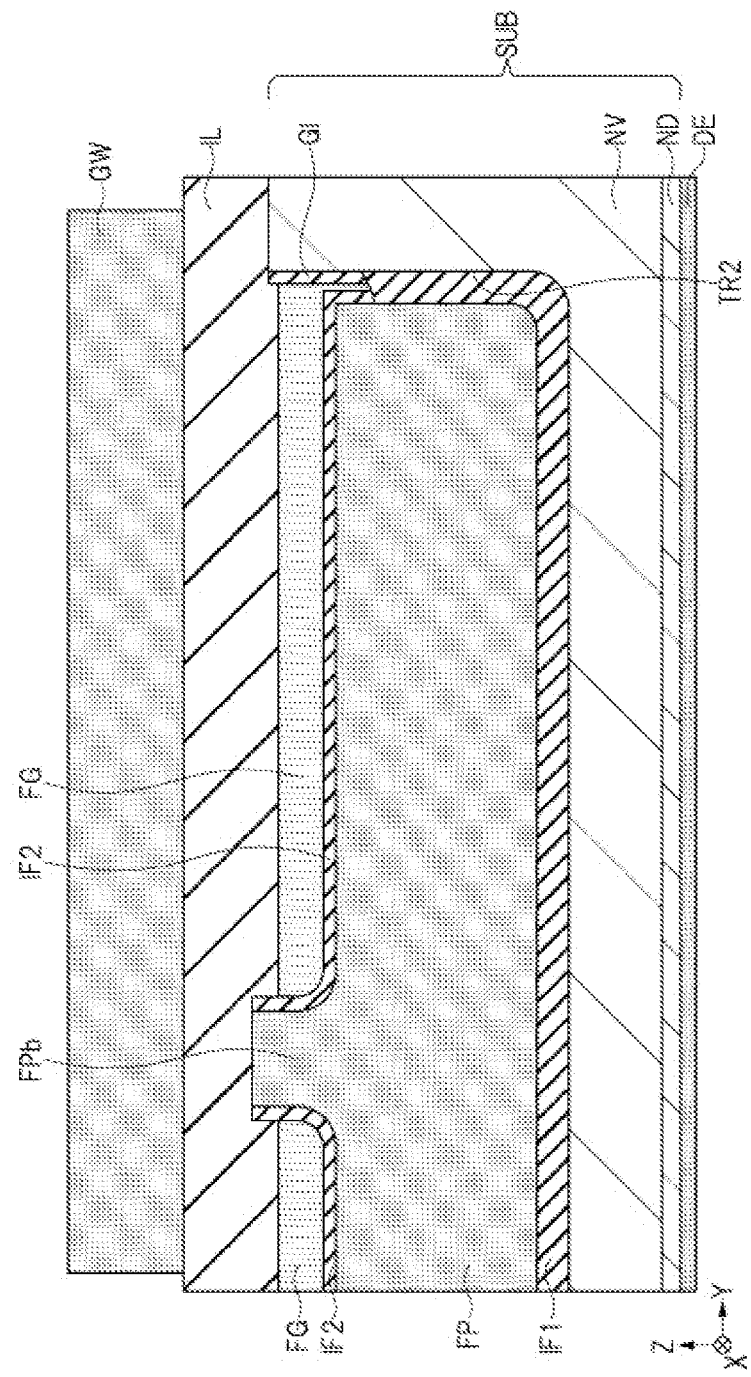
FIG. 5 is a cross-sectional view showing the semiconductor device according to the first embodiment.
Figure 6:
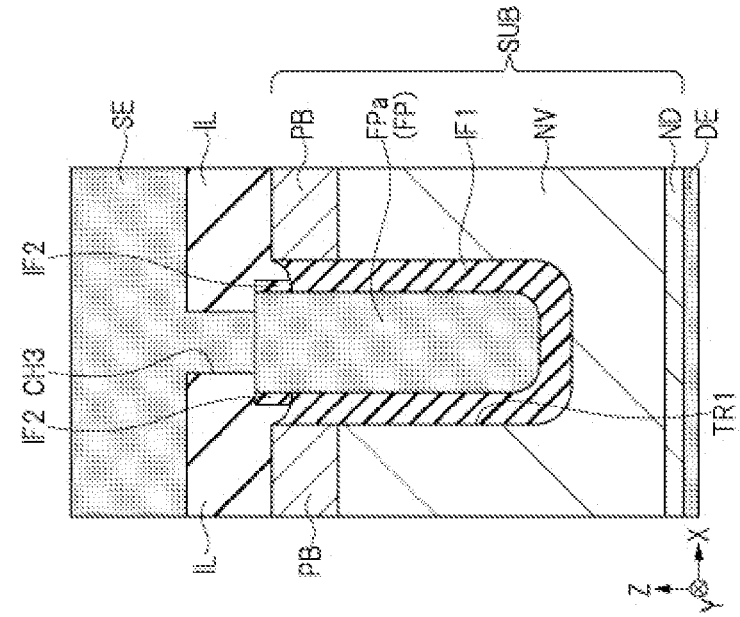
FIG. 6 is a cross-sectional view showing the semiconductor device according to the first embodiment.
Figure 6:
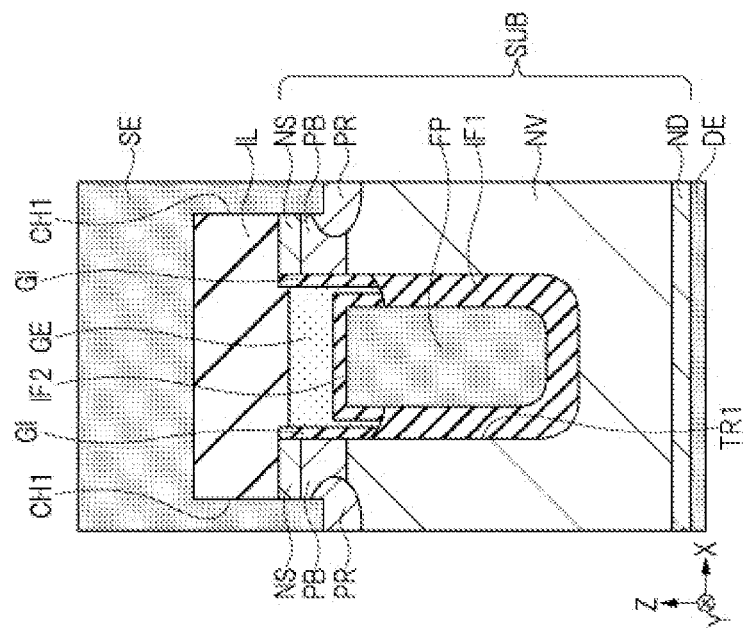

A semiconductor device 100 in the first embodiment will be described below with reference to FIGS. 1 to 6. FIG. 1 is a plan view of a semiconductor chip which is the semiconductor device 100. FIG. 2 and FIG. 3 are an enlarged plan view of the main portion in the region 1A shown in FIG. 1. FIG. 3 shows the lower structure of FIG. 2, and mainly showing the structure of the trench gate formed in the semiconductor substrate SUB. FIG. 4 is a cross-sectional view along A-A line shown in each of FIGS. 2 and 3. FIG. 5 is a cross-sectional view along B-B lines shown in each of FIGS. 2 and 3. FIG. 6 is a cross-sectional view along C-C and D-D lines shown in each of FIGS. 2 and 3.

FIG. 1 shows a wiring pattern formed mainly above a semiconductor substrate SUB. The semiconductor device 100 has a cell region CR in which a MOSFET is formed, and an outer peripheral region OR surrounding the cell region CR in a plan view. In the cell region CR, a main semiconductor element such as the MOSFET is formed. The outer peripheral region OR is used to connect a gate wiring GW with a gate electrode GE, to form a trench TR2 that functions as a termination region, and the like.

As shown in FIG. 1, the cell region CR is covered with a source electrode SE. In plan view, the gate wiring GW surrounds the source electrode SE. Although not illustrated here, the source electrode SE and the gate wiring GW are covered with a protective film such as a polyimide film. An opening is provided in a part of the protective film, and the source electrode SE and the gate wiring GW exposed in the opening become the source pad SP and the gate pad GP. An external connecting member such as a wire or a clip (copper plate) is connected to the source pad SP and the gate pad GP, so that the semiconductor device 100 is electrically connected to another semiconductor chip, a wire substrate, or the like.

The position of the hole CH1~CH4 shown in FIG. 2 coincides with the position of the hole CH1~CH4 shown in FIG. 3. As shown in FIG. 3, in the cell region CR and the outer peripheral region OR, the plurality of trenches TR1 extends in the Y direction, and are adjacent to each other in the X direction.

Inside the trench TR1, a field plate electrode FP is formed at a lower portion of the trench TR1, and the gate electrode GE or a floating gate electrode FG is formed at an upper portion of the trench TR1. A portion of the field plate electrode FP forms a contact portion FPa and a dividing portion FPb. The field plate electrode FP composing the contact portions FPa and the dividing portions FPb is formed not only at the lower portion of the trench TR1 but also at the upper portion of the trench TR1, in the trench TR1.

The contact portion FPa is formed in the cell region CR. The dividing portion FPb is formed in the outer peripheral region OR, and is located between the gate electrode GE and the floating gate electrode FG in the trench TR1. That is, the gate electrode GE and the floating gate electrode FG are physically separated by the dividing portion FPb.

A trench (termination trench) TR2 is formed in the outer peripheral region OR. The trench TR2 extends in each of the Y direction and the X direction so as to surround the cell region CR. The width of the trench TR2 is the same as that of the trench TR1.

Inside the trench TR2, a field plate electrode FP is formed at a lower portion of the trench TR2, and the floating gate electrode FG is formed at an upper portion of the trench TR2. Similar to the field plate electrode FP of the trench TR1, a portion of the field plate electrode FP formed in the trench TR2 extending in the Y direction forms the contact portion FPa and the dividing portion FPb.

As shown in FIG. 3, the trench TR2 may be provided with a corner portion TR2*a* connecting a portion extending in the Y direction and a portion extending in the X direction. The corner portion TR2*a* extends in a direction inclined at an angle of 45 degrees from the Y direction or the X direction in a plan view. Although it is not essential to provide the corner portion TR2*a*, when such a corner portion TR2*a* is not provided, a portion extending in the Y direction and a portion extending in the X direction are connected at right angles. In this case, variations in the thickness of an insulating film IF1 tend to occur at the right-angled portion, and the burying defect of the field plate electrode FP tends to occur. Therefore, in order to prevent such a problem from occurring, it is preferable that the trench TR2 is provided with a corner portion TR2*a*.

A p-type body region PB is formed in the semiconductor substrate SUB located in a portion of the outer peripheral region and the semiconductor substrate SUB located in the cell region CR. An n-type source region NS is formed in the body region PB located in the cell region CR at a surface of a portion of the body region PB. A p-type floating region FBR1~FBR3 is formed in the semiconductor substrate SUB located in the outer peripheral region OR. The body region PB is spaced apart from the floating region FBR1~FBR3. The floating regions FBR1~FBR3 are spaced apart from each other.

The floating region FBR1 is formed in the semiconductor substrate SUB located between the trench TR1 of the outer peripheral region OR and the trench TR2 extending in the X-direction. The floating region FBR2 and the floating region FBR3 are formed between the trenches TR1 in the X direction, and are located between the floating region FBR1 and the body region PB in the Y direction.

A hole CH1 is formed on the source region NS. As will be described later, the hole CH1 also reaches the body area PB. The source electrode SE is electrically connected to the source region NS and the body region PB via the hole CH1. A hole CH2 is formed on the gate electrode GE. The gate electrode GE is electrically connected to the gate wiring GW via the hole CH2. A hole CH3 is formed on the contact portion FPa of the trench TR1. The contact portion FPa of the trench TR1 is electrically connected to the source electrode SE via the hole CH3. A hole CH4 is formed on the contact portion FPa of the trench TR2. The contact portion FPa of the trench TR2 is electrically connected to the source electrode SE via the hole CH4.

The cross-sectional configuration of the semiconductor device 100 will be described below with reference to FIGS. 4 to 6. First, a basic structure of the MOSFET formed in the cell region CR will be described using C-C cross section and D-D cross section of FIG. 6.

As shown in FIG. 6, the semiconductor device 100 includes an n-type semiconductor substrate SUB having an upper surface and a bottom surface. The semiconductor substrate SUB has an n-type drift region NV of low concentration. Here, the n-type semiconductor substrate SUB itself composes the drift region NV. Note that the drift region NV may be an n-type semiconductor layer grown on an n-type silicon substrate while introducing phosphorus (P) by an epitaxial growth method. In the present application, a stack of such n-type silicon substrate and the n-type semiconductor layer is also described as being the semiconductor substrate SUB.

In the semiconductor substrate SUB at upper surface end, a trench TR1 that reaches a predetermined depth from upper surface of semiconductor substrate SUB is formed. The depth of the trench TR1 is, for example, 5 μm or more and 7 μm or less. The depth of the trench TR2 shown in FIGS. 4 and 5 is also the same as the depth of the trench TR1. Inside the trench TR1, the field plate electrode FP is formed at a lower portion of the trench TR1 via the insulating film IF1, and the gate electrode GE is formed at an upper portion of the trench TR1 via the gate insulating film GI. The upper surface of the gate electrode GE is slightly retracted from the upper surface of the semiconductor substrate SUB.

The position of the upper surface of the insulating film IF1 is lower than the position of the upper surface of the field plate FP. The gate insulating film GI is formed inside the trench TR1 and formed above the insulating film IF1. An insulating film IF2 is formed on an upper surface and a side surface of the field plate electrode FP exposed from the insulating film IF1. The gate electrode GE is also formed between the field plate electrode FP exposed from the insulating film IF1 and semiconductor substrate SUB via the gate insulating film GI and the insulating film IF2.

The insulating film IF1 is formed between the semiconductor substrate SUB and the field plate FP. The insulating film IF2 is formed between the gate electrode GE and the field plate electrode FP. The gate insulating film GI is formed between the semiconductor substrate SUB and the gate electrode GE. The semiconductor substrate SUB, the gate electrode GE, and the field plate electrode FP are electrically insulated from each other by the insulating films.

The gate electrode GE and the field plate electrode FP are made of, for example, a polycrystalline silicon film into which an n-type impurity is introduced. The insulating film IF1, the insulating film IF2, and the gate insulating film GI are made of, for example, a silicon oxide film.

The thickness of the insulating film IF1 is larger than the thickness of each of the insulating film IF2 and the gate insulating film GI. The thickness of the insulating film IF1 is, for example, 400 nm or more and 600 nm or less. The thickness of each of the insulating film IF2 and the gate insulating film is, for example, not less than 50 nm and not more than 80 nm.

In the semiconductor substrate SUB at upper surface of semiconductor substrate SUB, a p-type body area PB is formed so as to be shallower than the depth of the trench TR1. In the body region PB, an n-type source region NS is formed. The source region NS has a higher impurity concentration than the drift region NV.

On the lower surface of semiconductor substrate SUB, an n-type drain region ND is formed in the semiconductor substrate SUB. The drain region ND has a higher impurity concentration than the drift region NV. A drain electrode DE is formed under the lower surface of semiconductor substrate SUB. The drain electrode DE consist of a single layer of metallic membranes, such as aluminum membranes, titanium membranes, nickel membranes, gold membranes or silver membranes, or laminated membranes with these metallic membranes laminated accordingly. The drain region ND and the drain electrode DE are formed over the cell region CR and the outer peripheral region OR. The drain potential is supplied to semiconductor substrate SUB (drain region ND, drift region NV) from the drain electrode DE.

An interlayer insulating film IL is formed on an upper surface of the semiconductor substrate SUB so as to cover the trench TR1. The interlayer insulating film IL is formed of, for example, a silicon oxide film. The thickness of the interlayer insulating film IL is, for example, 700 nm or more and 900 nm or less. The interlayer insulating film IL may be a stacked film of a thin silicon oxide film and a thick silicon oxide film (PSG: Phospho Silicate Glass film) containing phosphorus.

A hole CH1 reaching the source region NS and the body region PB is formed in the interlayer insulating film IL. At the bottom of the hole CH1, a high-concentration diffused region PR is formed in the body region PB. The high-concentration diffused region PR has a higher impurity concentration than the body region PB.

A source electrode SE is formed on the interlayer insulating film IL. The source electrode SE is embedded in the hole CH1, is electrically connected to the source region NS, the body region PB, and the highly diffused region PR, and supplies a source potential (grounding potential) to these impurity regions.

As shown in D-D cross-section of FIG. 6, a portion of the field plate electrode FP forms a contact portion FPa of the field plate electrode FP. The position of the insulating film IF1 in contact with the field plate electrode FP other than the contact portion FPa is lower than the position of upper surface of the insulating film IF1 in contact with the contact portion FPa. That is, the position of the upper surface of the insulating film IF1 of C-C cross section is located at a depth of not less than 300 nm and not more than 400 nm from the upper surface of the semiconductor substrate SUB. The position of the upper surface of the insulating film IF1 in D-D cross section is located at a depth of not less than 50 nm and not more than 100 nm from upper surface of the semiconductor substrate SUB.

In addition, the position of upper surface of the contact portion FPa is higher than the position of upper surface of the semiconductor substrate SUB, and is located at a height equal to or higher than 200 nm and equal to or lower than 400 nm of the semiconductor substrate SUB.

A hole CH3 reaching the contact portion FPa is formed in the interlayer insulating film IL. The source electrode SE is embedded in the hole CH3, electrically connected to the field plate electrode FP, and supplies a source potential to the field plate electrode FP.

The cross-sectional structure of the dividing portion FPb is substantially the same as the structure of D-D cross-section except that no hole is formed on the dividing portion FPb.

Next, the structure of the outer peripheral region OR will be described using A-A cross section of FIG. 4 and B-B cross section of FIG. 5.

Inside the trench TR1 in the outer peripheral region OR, a field plate electrode IF1 is formed in a lower portion of the trench FP, and the floating gate electrode FG is formed in the upper portion of the trench TR1 through a gate insulating film GI. Inside the trench TR2, a lower portion of the trench TR2 is formed with a field plate electrode IF1 interposed therebetween, and a field plate electrode FP is formed with a gate insulating film GI interposed therebetween, and the floating gate electrode FG is formed with a gate insulating film IF1 interposed therebetween. An insulating film IF2 is formed on an upper surface and a side surface of the field plate electrode FP, which are exposed from the insulating film IF1. The upper surface of the floating gate electrode FG is slightly retracted from the upper surface of the semiconductor substrate SUB.

The insulating film IF1 is formed between the semiconductor substrate SUB and the field plate FP. The insulating film IF2 is formed between the floating gate electrode FG and the field plate electrode FP. The gate insulating film GI is formed between the semiconductor substrate SUB and the floating gate electrode FG. Further, inside TR1 of the trench, the gate electrode GE and the floating gate are physically separated by the dividing portion FPb.

Therefore, inside TR1 of the trench, the semiconductor substrate SUB, the gate electrode GE, the field plate electrode FP and the floating gate electrode FG are electrically insulated from each other by the dividing portion FPb, the insulating film IF1, the insulating film IF2 and the gate insulating film GI. Also, in TR2 of the trench, the semiconductor substrate SUB, the field plate electrode FP and the floating gate electrode FG are electrically insulated from each other by the dividing portion FPb, the insulating film IF1, the insulating film IF2 and the gate insulating film GI.

The p-type floating area FBR1~FBR3 is formed in the semiconductor substrate SUB at the upper surface of the semiconductor substrate SUB. The floating region FBR1~FBR3 has the same impurity concentration as that of the body region PB. The depth of each of the floating regions FBR1~FBR3 is shallower than the depth of each of the trench TR1 and the trench TR2.

The interlayer insulating film IL is formed so as to cover the trench TR1 and the trench TR2. The gate wiring GW is formed on the interlayer insulating film IL. The gate electrode GE is also formed in a portion of the trench TR1 in the outer peripheral region OR. As shown in FIG. 4, a hole CH2 reaching the gate electrode GE is formed in the interlayer insulating film IL. The gate wiring GW is embedded in the hole CH2, electrically connected to the gate electrode GE, and supplies a gate potential to the gate electrode GE.

The cross-sectional structure of the portion where the hole CH4 of FIG. 3 is located is substantially the same as the structure of D-D cross-section of FIG. 6. Therefore, although not illustrated here, a hole CH4 reaching the contact portion FPa of the trench TR2 is formed in the interlayer insulating film IL. The source electrode SE is embedded in the hole CH4, is electrically connected to the field plate electrode TR2 of the trench FP, and supplies a source potential to the field plate electrode FP of the trench.

The floating regions FBR1~FBR3 and the floating gate electrodes FG are not connected to any of the gate wiring GW, the source electrode SE and the drain electrode DE. Therefore, the gate potential, the source potential and the drain potential are not supplied to the floating regions FBR1~FBR3 and the floating gate electrodes FG.

In addition, the source electrode SE and the gate wiring GW include, for example, a barrier metal film and a conductive film formed on the barrier metal film. The barrier metal film is, for example, a titanium nitride film, and the conductive film is, for example, an aluminum film.

Note that the source electrode SE and the gate wiring GW may be comprised of a plug layer filling the inside of the hole CH1~CH4 and a wiring layer formed on the interlayer insulating film IL. In this case, the wiring layer includes the barrier metal film and the conductive film. The plug layer is formed of, for example, a stacked film of a barrier metal film such as a titanium nitride film and a conductive film such as a tungsten film.

<Examined Example and Key Feature of First Embodiment>

Figure 7:
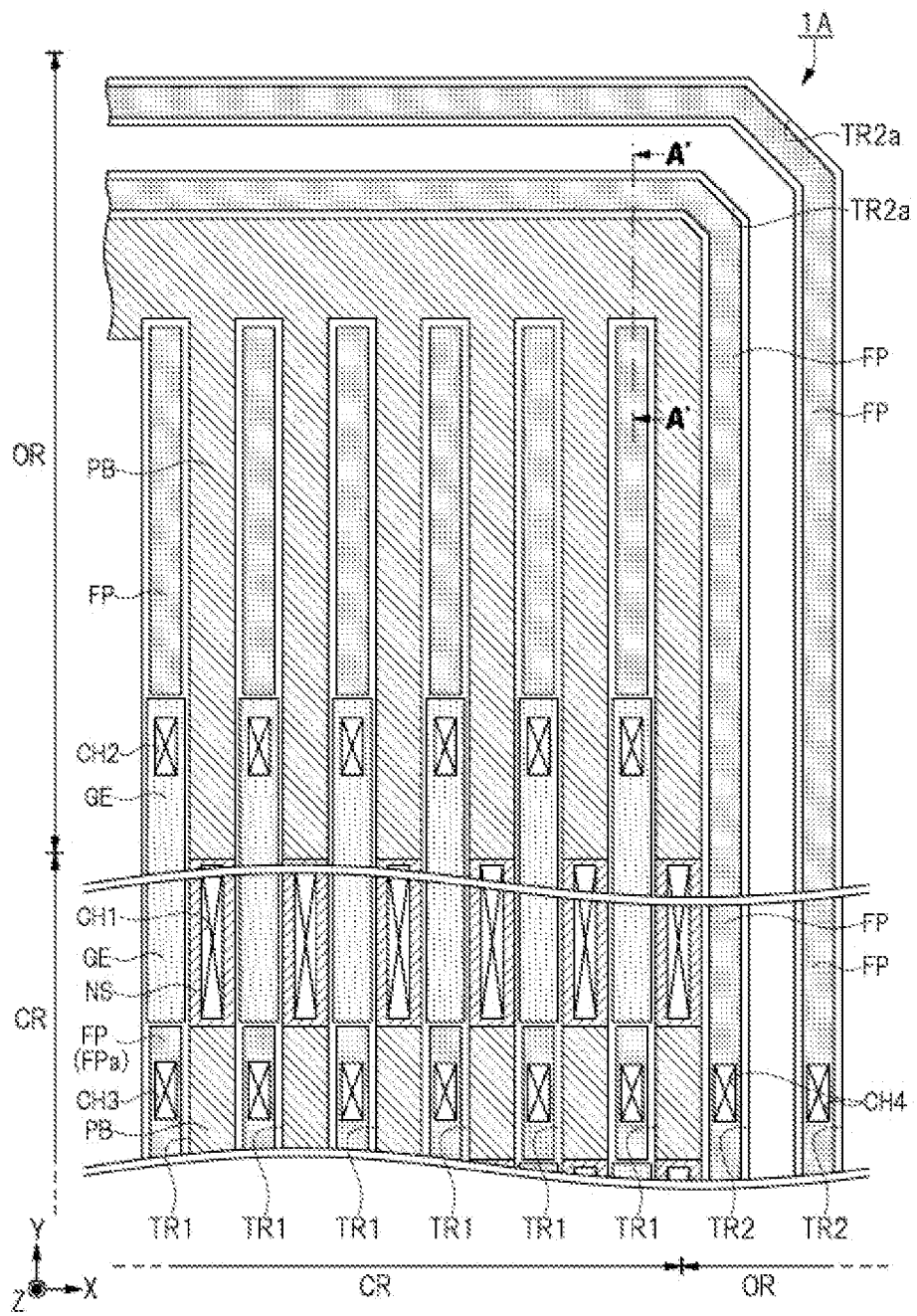
FIG. 7 is an enlarged plan view showing a main portion of a semiconductor device according to a first examined example.
Figure 8:
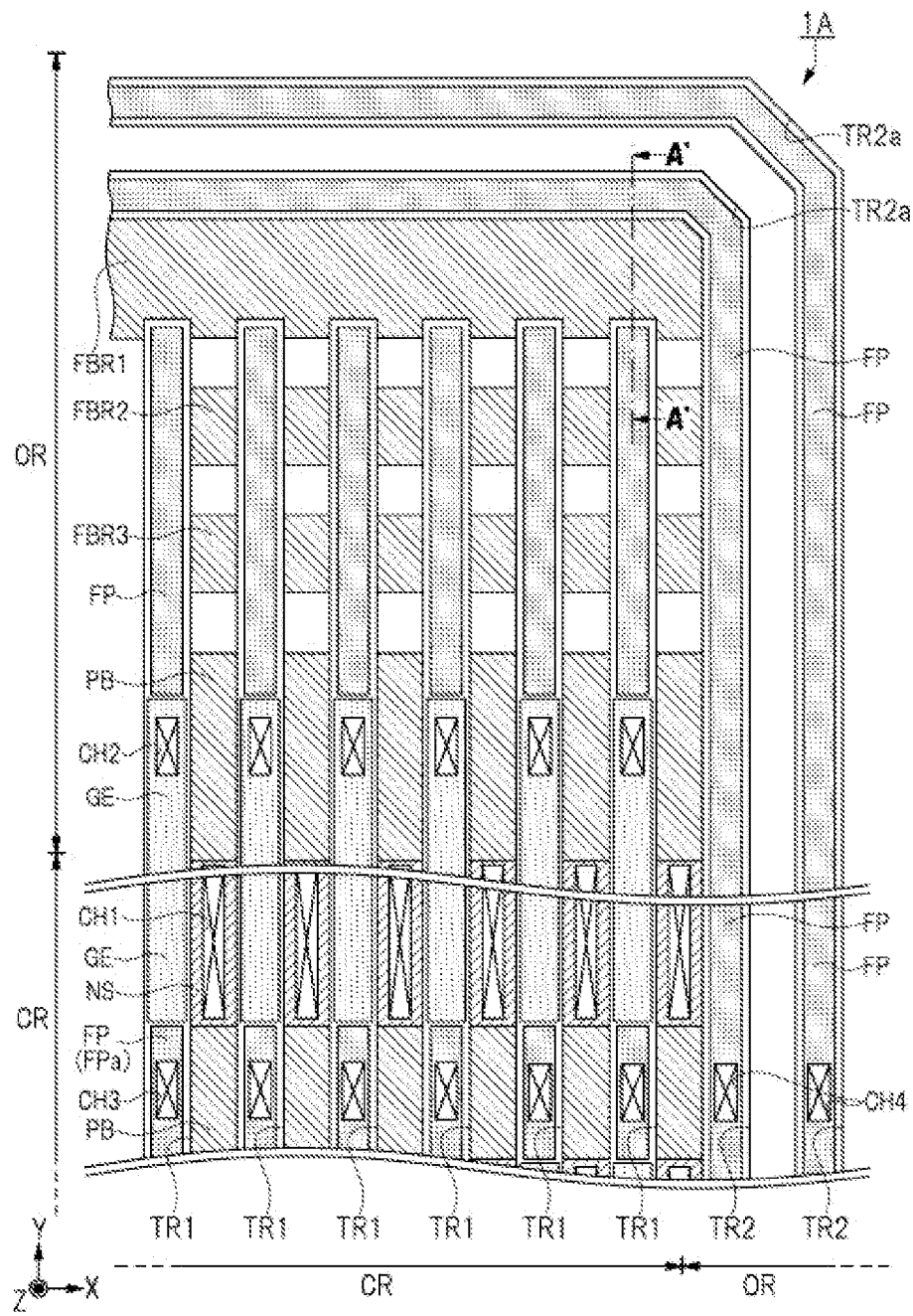
FIG. 8 is an enlarged plan view showing a main portion of a semiconductor device according to a second examined example.
Figure 9:
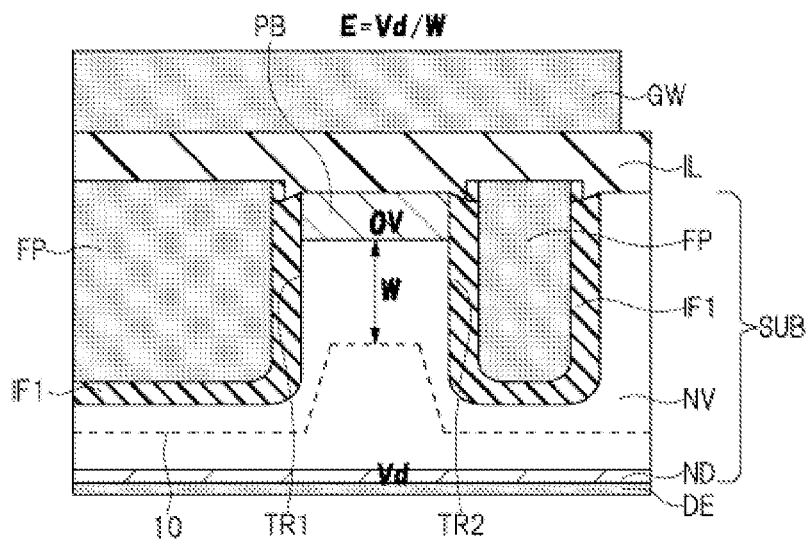
FIG. 9 is an enlarged cross-sectional view showing the semiconductor device according to the first examined example.
Figure 10:
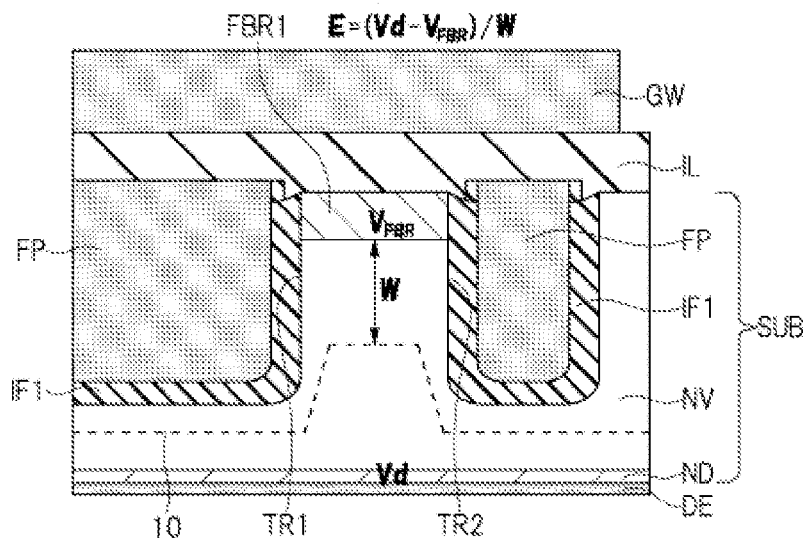
FIG. 10 is an enlarged cross-sectional view showing the semiconductor device according to the second examined example.

FIG. 7 is an enlarged plan view showing a main portion of a semiconductor device according to the first examined example. FIG. 8 is an enlarged plan view showing a main portion of a semiconductor device according to the second examined example. FIG. 9 and FIG. 10 are a cross-sectional view along A'-A' line shown in each of FIGS. 7 and 8. A'-A' line corresponds to a portion of A-A line shown in FIG. 3.

As shown in FIG. 7, in the first examined example, the floating regions FBR1 to 3 are not formed in the outer peripheral region OR, and the body region PB is formed from the cell region CR to the trench TR2. In addition, in the first examined example, the trench TR1 and the trench TR2 are not formed with the floating gate electrode FG on the upper portions thereof, and the field plate electrode FP is buried inside the trench TR1 and the trench TR2 in the outer peripheral region OR.

As shown in FIG. 8, in the second examined example, similar to the first embodiment, the floating regions OR are formed with the floating regions FBR1 to 3, but similar to the first examined example, the floating gate electrodes TR1 and the trench TR2 are not formed with the floating gate electrode FG on the upper portions thereof.

FIG. 9 and FIG. 10 schematically show the state of the electric field strength applied to the body region PB and the floating region FBR1 of the outer peripheral region OR when the MOSFET is in the off-state.

For example, as illustrated in FIG. 9, in the outer peripheral region OR, a distance between the trench TR1 and the trench TR2 may be longer than an optimum value. As a result, the depletion layer 10 generated from the body area PB is not sufficiently deep and wide, the electric field strength E is increased, and the breakdown voltage is lowered. Note that the electric field strength E is expressed by "E=Vd/W" using the drain potential Vd and the width W of the depletion layer 10.

On the other hand, as shown in FIG. 10, when the FBR structure is applied, the potential that was 0V in the body region PB gradually increases as it passes through the floating region FBR3, the floating region FBR2, and the floating region FBR1. Therefore, when the potential of the floating area FBR1 is expressed by VFBR (>0V), the electric field strength E is expressed by "E=(Vd−VFBR)/W". That is, since the electric field is relaxed in the outer peripheral region OR, the breakdown voltage can be improved.

Basically, when the number of floating regions FBR is larger, the potential rises stepwise, so that the potential of the floating region FBR1 is likely to be increased eventually. Here, as in the case of the floating region FBR1~FBR3, the number of the floating region FBR is three, but the number of the floating region FBR and the arrangement spacing thereof can be freely designed as appropriate. At least one floating region FBR (floating region FBR1) may be formed. This is the same in the first embodiment.

Figure 11:
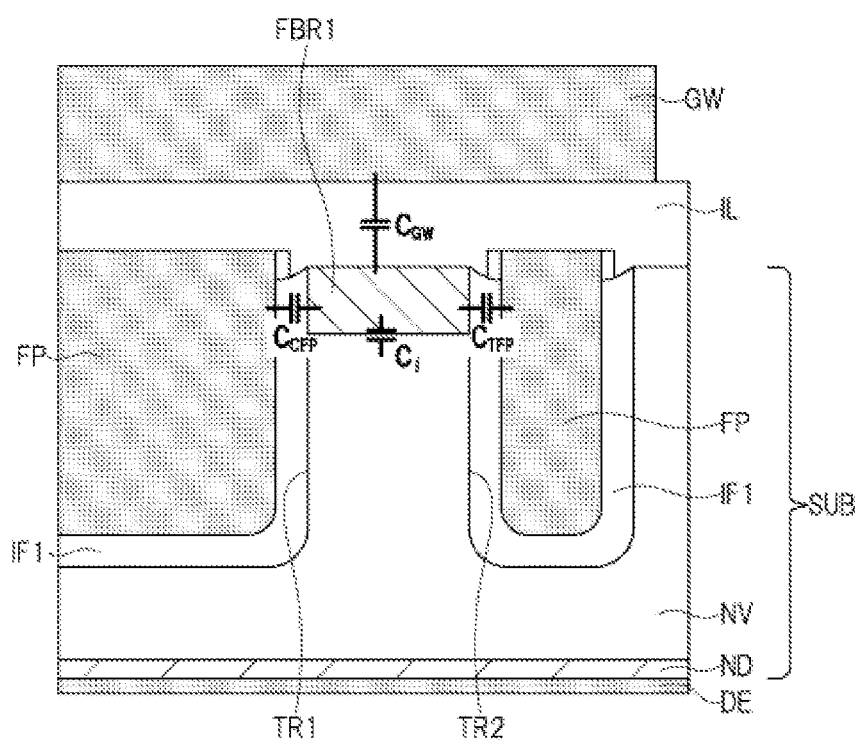
FIG. 11 is an enlarged cross-sectional view showing the semiconductor device according to the second examined example.

FIG. 11 schematically illustrates the relationship between the floating area FBR1 and the potential around the floating area. The potential φFBR of the floating area FBR1 is obtained by Equation 1 below. φGW is the potential of the gate wiring GW, φCFP is the potential of the field plate electrode FP in the trench TR1, and φTFP is the potential of the field plate electrode FP in the trench TR2. Vd is the potential of the drain electrode DE.

$$C_{CFP} \cdot (\psi_{FBR} - \psi_{CFP}) + C_{TFP} \cdot (\psi_{FBR} - \psi_{TFP}) +$$
$$C_{GW} \cdot (\psi_{FBR} - \psi_{GW}) + C_j \cdot (\psi_{FBR} - V_d) = 0$$
$$\therefore \psi_{FBR} = \frac{C_j}{C_{CFP} + C_{TFP} + C_{GW} + C_j} \cdot V_d$$

[Equation 1]

Here, when the MOSFET is off-state, φGW, φCFP and φTFP are 0V. Therefore, the potential increasement of the floating region FBR1 is suppressed by the capacitive coupling through the insulating film around the floating region FBR1. That is, an attempt is made to fix the floating area FBR1 to 0V. Therefore, it cannot be said that the second examined example is sufficiently effective to reduce the breakdown voltage of the outer peripheral region OR.

Therefore, as shown in FIGS. 3 to 5, in the first embodiment, the floating gate electrode FG is provided above each of the trench TR1 and the trench TR2. The floating gate electrode FG is not electrically connected to the gate wiring GW, the source electrode SE, and the drain electrode DE, and no potential is supplied thereto. Therefore, in Equation 1 described above, since the capacitance CφCFP and the capacitance CφTFP can be regarded as being very small, the potential φFBR of the floating area FBR1 can be increased.

Figure 12:
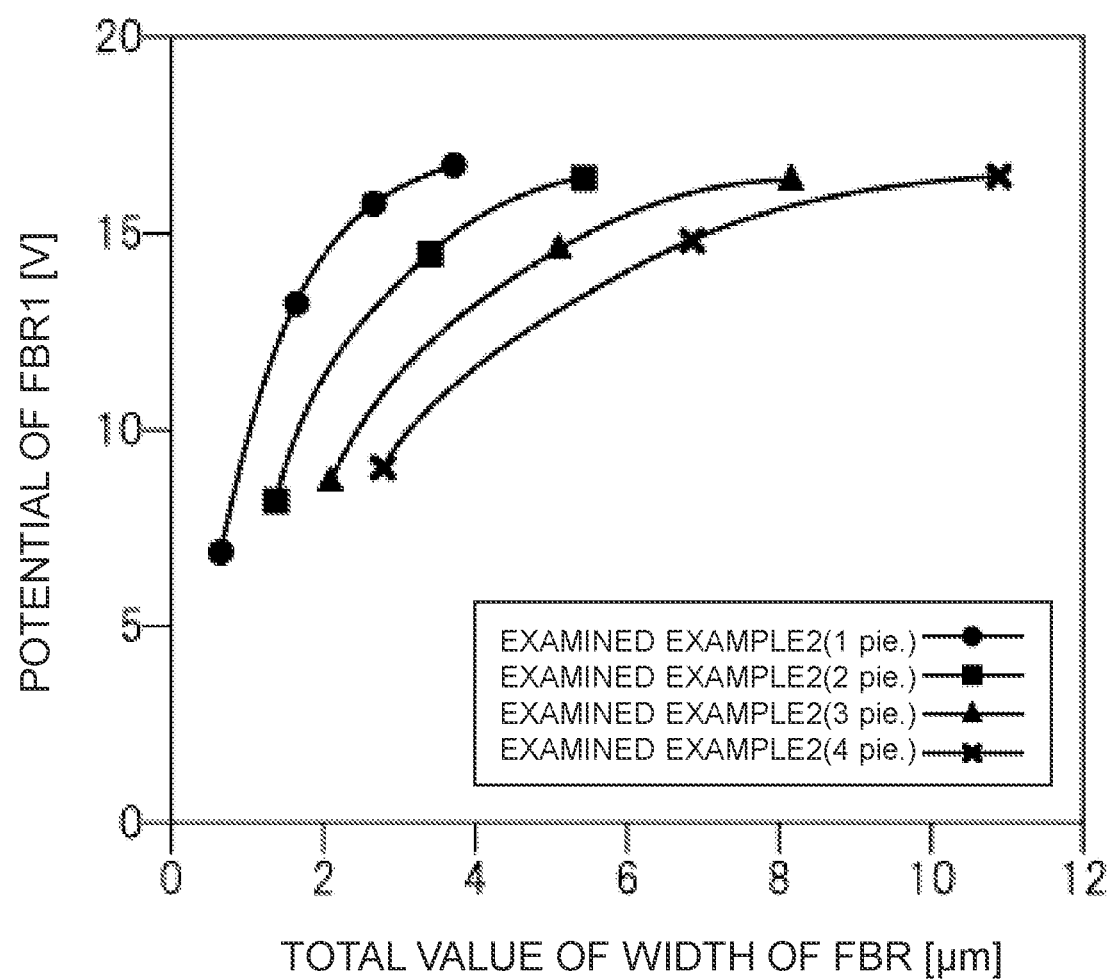
FIG. 12 is a graph showing a measured result of the second examined example.
Figure 13:
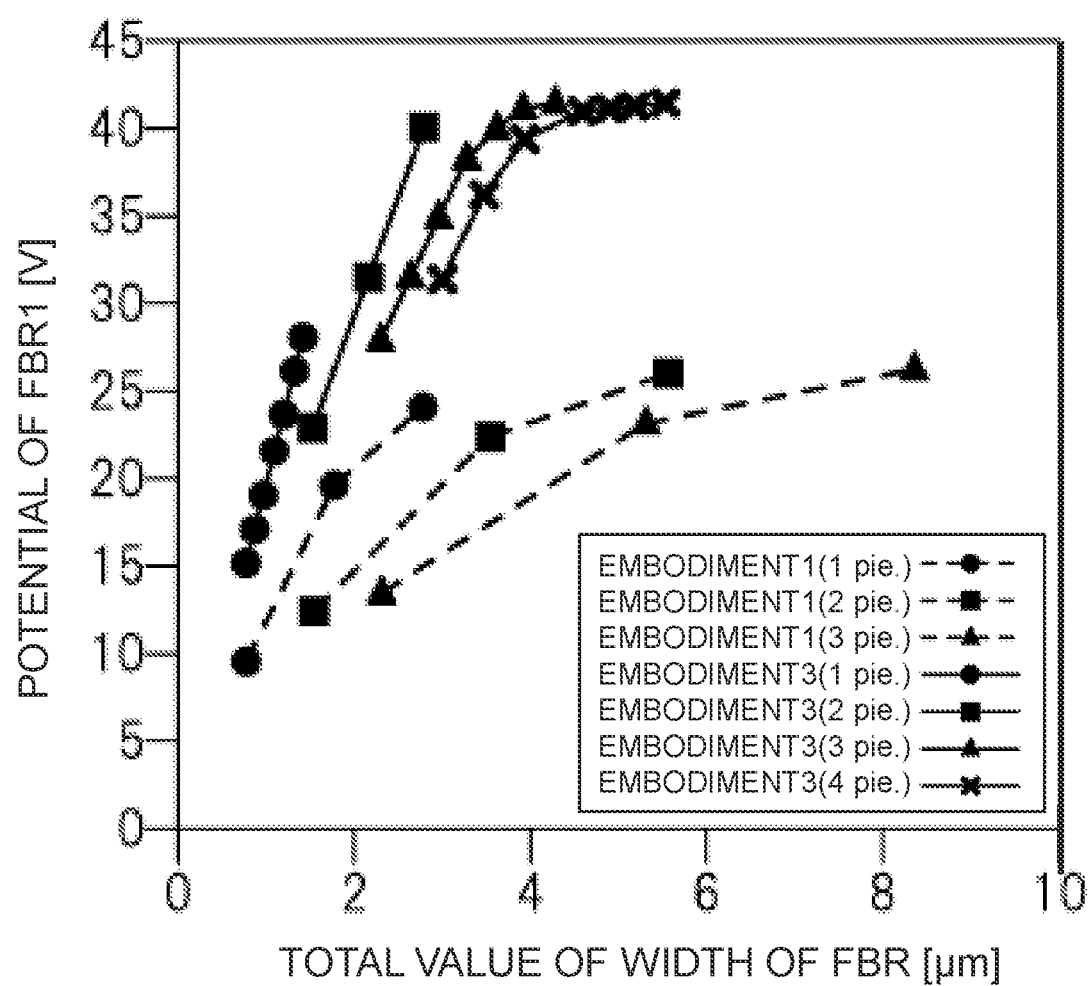
FIG. 13 is a graph showing a measured result of each of the first embodiment and a third embodiment.

FIG. 12 and FIG. 13 are a graph showing the measured result of the potential increasement of the floating region FBR1 in each of the second examined example and the first embodiment. Note that "1 pie." or "2 pie." in the graphs each indicate the number of the floating areas FBR. As shown in FIGS. 12 and 13, it can be seen that a potential increasement of 160% or more of the second examined example can be achieved by the first embodiment.

As described above, according to the first embodiment, even if the distance between the trench TR1 and the trench TR2 becomes longer than the optimum value, the potential increasement in the floating area FBR1 can be more effectively exhibited than the second examined example. Therefore, a decrease in the breakdown voltage in the outer peripheral region OR can be sufficiently suppressed, and the reliability of the semiconductor device 100 can be improved.

Incidentally, the dividing portion FPb of the trench TR2 is not essential and may not be formed. In other words, the two floating gate electrodes FG divided by the dividing portion FPb of the trench TR2 may be formed in one body. However, as will be described later, the dividing portion FPb is formed when the field plate electrode FP is patterned, but when the dividing portion FPb of the trench TR2 is not formed, the shape of the dividing portion FPb of the trench TR1 closest to the trench TR2 may be distorted as compared with the shape of the dividing portion FPb of the other trench TR1. Therefore, by forming the dividing portion FPb of the trench TR2 as a dummy pattern, the shape of the dividing portion FPb of the trench TR1 is easily stabilized.

<Method of Manufacturing Semiconductor Device>

Each manufacturing step included in a method of manufacturing the semiconductor device 100 will be described below with reference to FIGS. 14 to 31. The following discussion uses A-A cross-section of FIG. 4 and C-C and D-D cross-sections of FIG. 6. Note that the trench TR2 shown in B-B cross section of FIG. 5 is formed in the same manufacturing process as the trench TR1, and the structures such as the field plate electrode FP and the floating gate electrode FG formed in the trench TR2 are formed in the same manufacturing process as the structures formed in the trench TR1. Therefore, B-B cross section is not shown.

Figure 14:
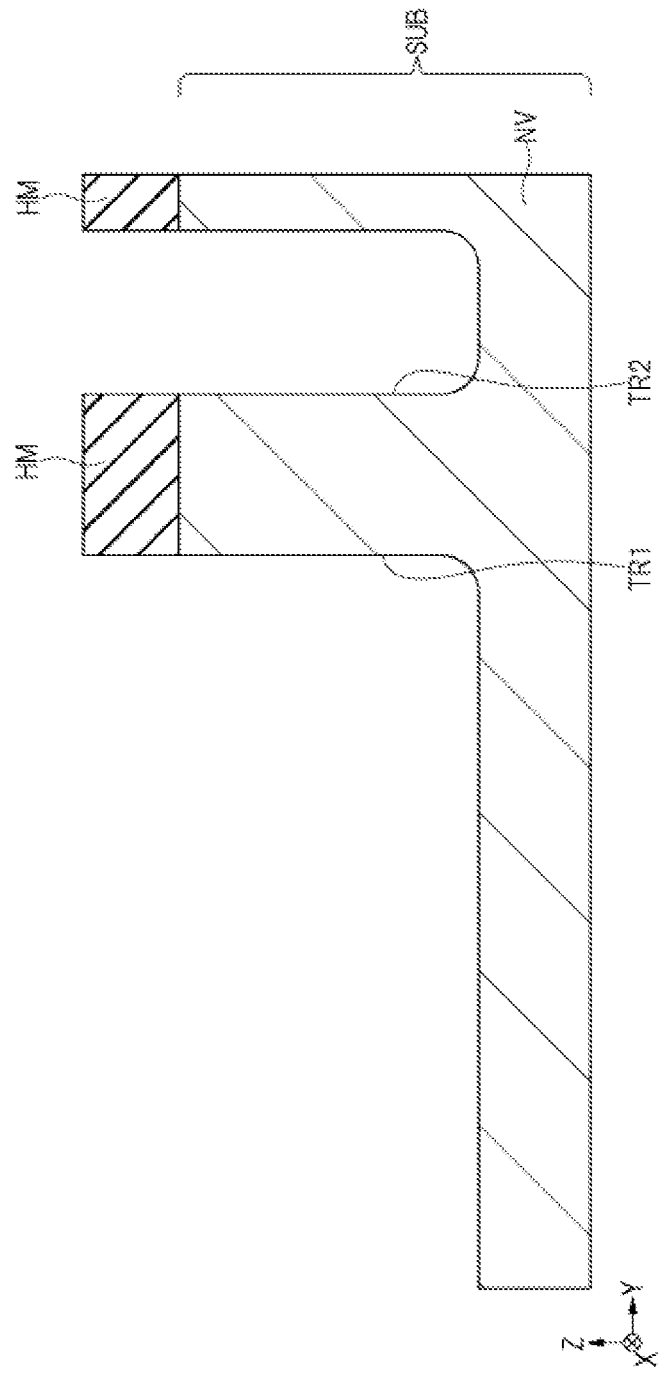
FIG. 14 is a cross-sectional view showing a manufacturing process of the semiconductor device according to the first embodiment.
Figure 15:
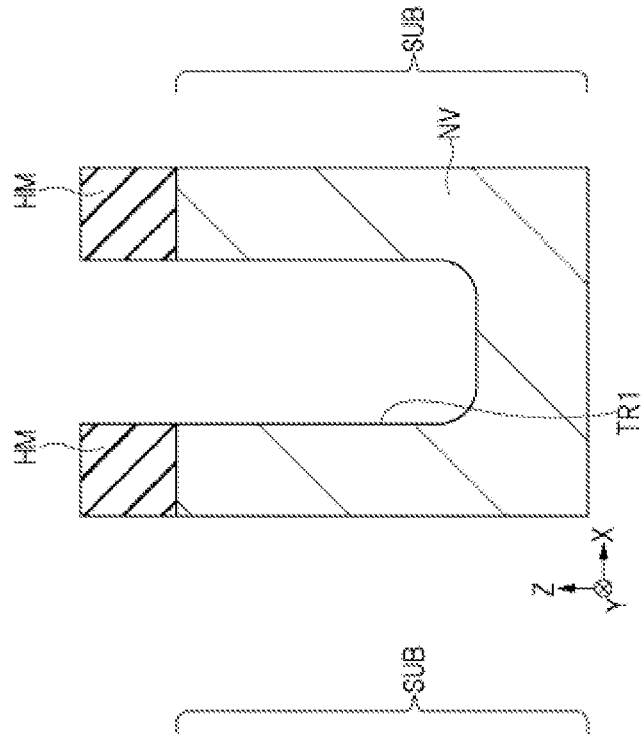
FIG. 15 is a cross-sectional view showing a manufacturing process of the semiconductor device according to the first embodiment.
Figure 15:
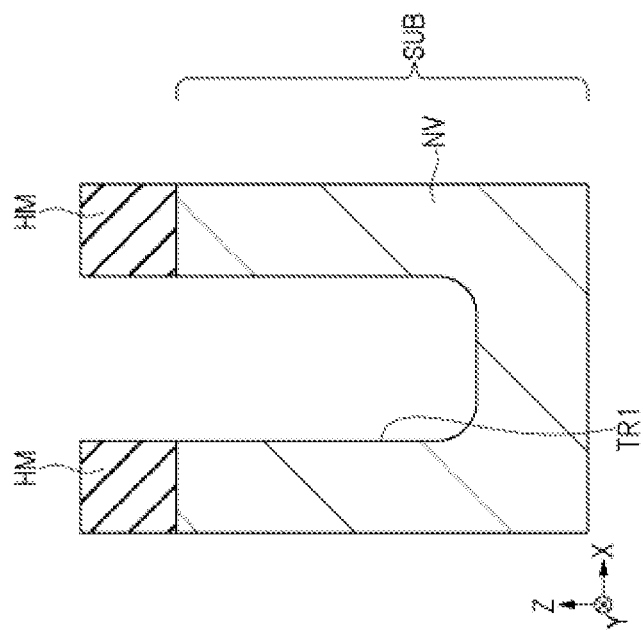

As shown in FIGS. 14 and 15, first, an n-type semiconductor substrate SUB having an upper surface and a lower surface is prepared. As described above, the n-type semiconductor substrate SUB itself constitute the drift region NV, but the drift region NV may be the n-type semiconductor layer grown on the n-type silicon substrate while introducing phosphorus (P) by epitaxial growth.

Next, a trench TR1 and a trench TR2 are formed in the semiconductor substrate SUB at the upper surface of the semiconductor substrate SUB. In order to form the trench TR1 and the trench TR2, for example, a silicon oxide film is first formed on the semiconductor substrate SUB by, for example, a CVD method. Next, a resist pattern having an opening is formed on the silicon oxide film by a photolithography technique. Next, a dry etching process is performed using the resist pattern as a mask, whereby the silicon oxide film is patterned to form a hard mask HM. Next, the resist pattern is removed by performing an asking treatment. Next, a dry etching process is performed using the hard mask HM as a mask to form a trench TR1 and a trench TR2 in the semiconductor substrate SUB. Thereafter, the hard mask HM is removed by, for example, a wet etching process using a hydrofluoric acid-containing solution.

Figure 16:
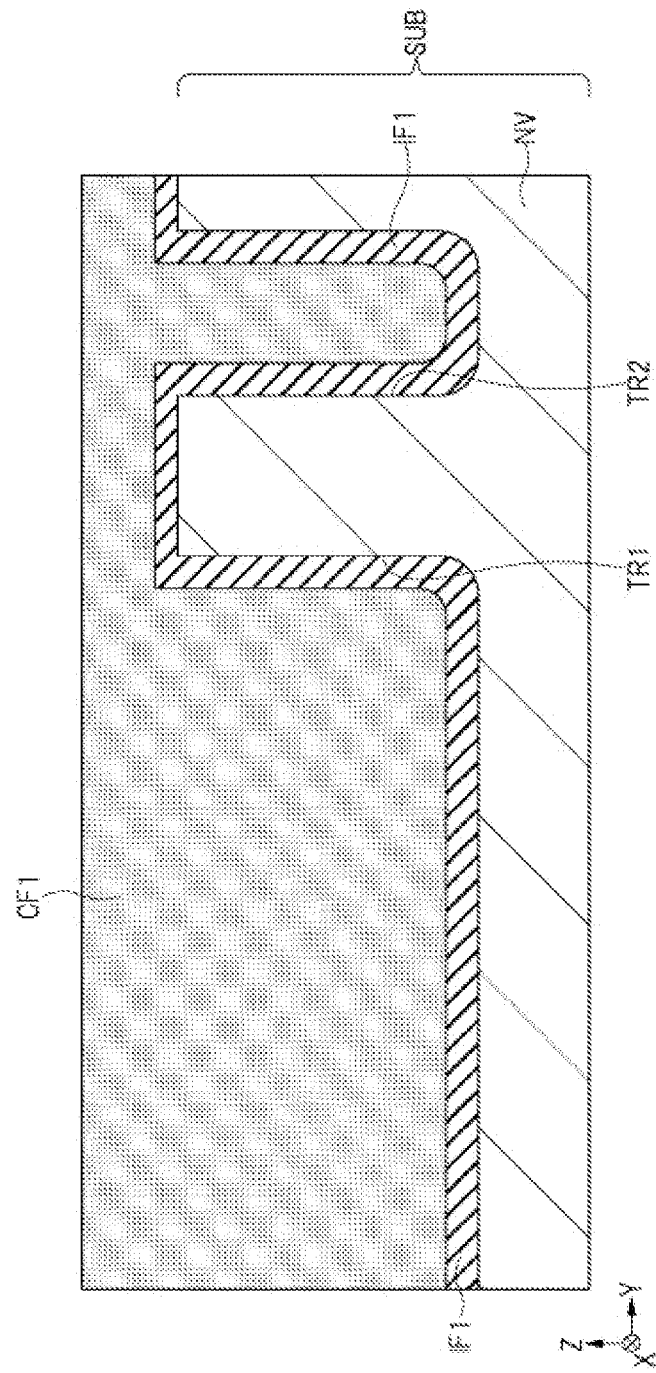
FIG. 16 is a cross-sectional view showing the manufacturing process of the semiconductor device following FIG. 14.
Figure 17:
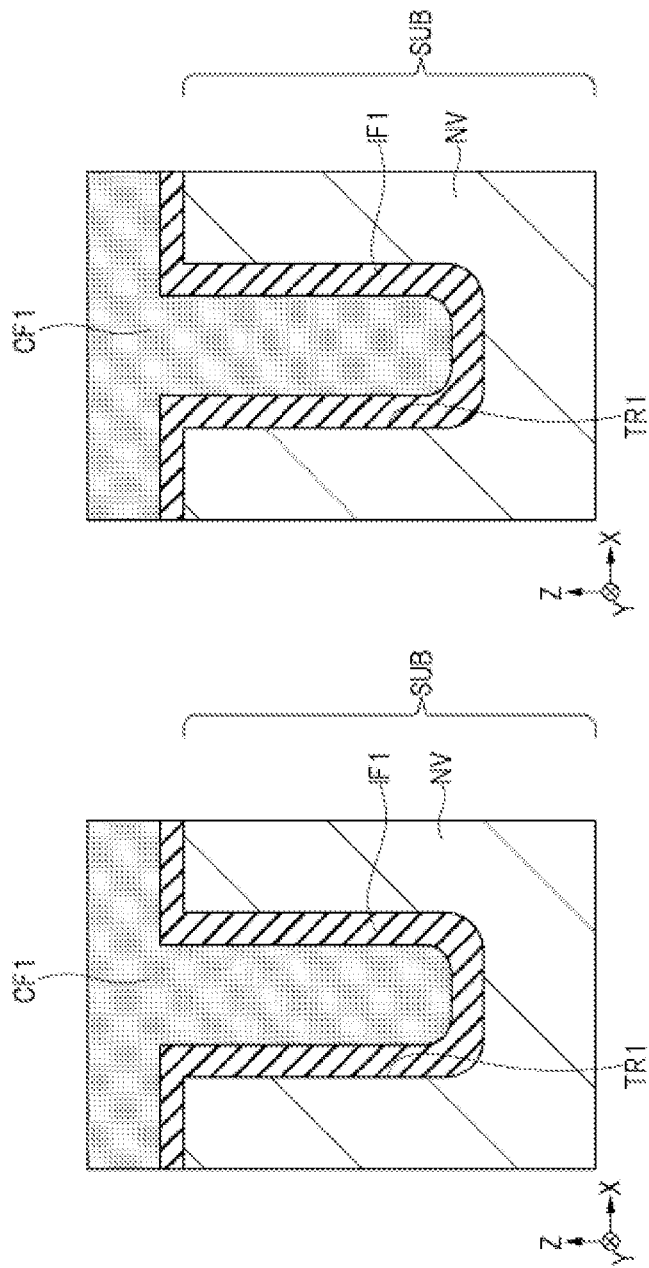
FIG. 17 is a cross-sectional view showing the manufacturing process of the semiconductor device following FIG. 15.

As shown in FIGS. 16 and 17, first, an insulating film IF1 is formed on the inside of the trench TR1, the inside of the trench TR2, and the semiconductor substrate SUB by, for example, a thermal oxidation method or a CVD method.

Next, a conductive film CF1 is formed on the insulating film IF1 by, for example, a CVD method so as to fill the inside of the trench TR1 and the inside of the trench TR2. The conductive film CF1 is, for example, an n-type polycrystalline silicon film.

Figure 18:
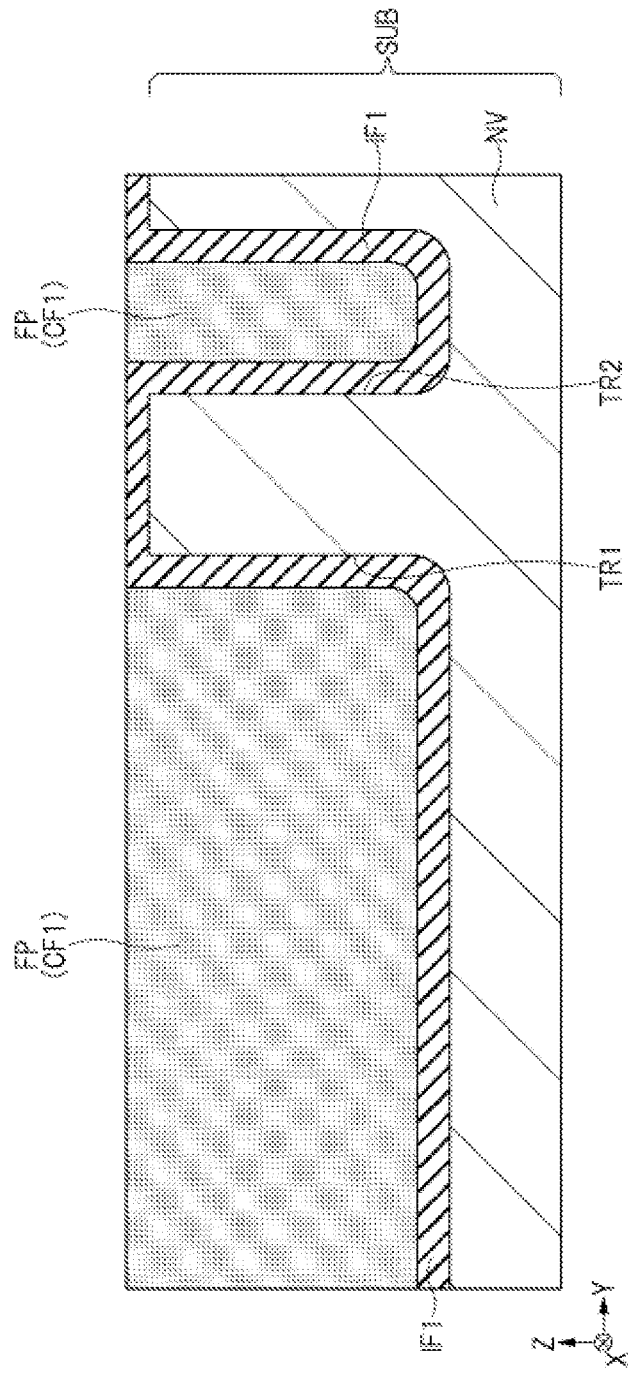
FIG. 18 is a cross-sectional view showing the manufacturing process of the semiconductor device following FIG. 16.
Figure 19:
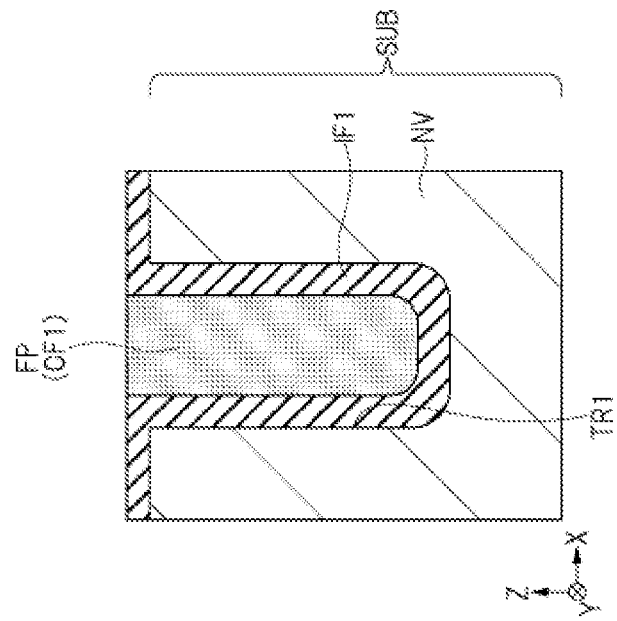
FIG. 19 is a cross-sectional view showing the manufacturing process of the semiconductor device following FIG. 17.
Figure 19:
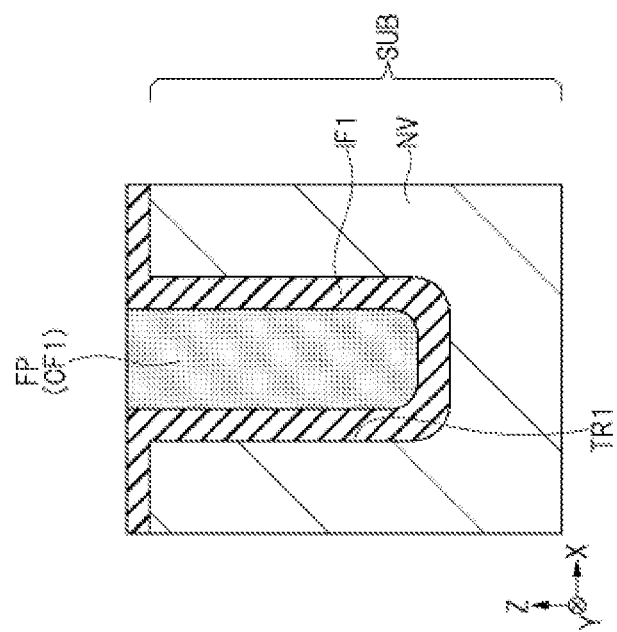

As shown in FIGS. 18 and 19, the conductive film CF1 formed outside the trench TR1 and outside the trench TR2 is removed by performing a polishing process or an anisotropic etch process using, for example, CMP (Chemical Mechanical Polishing) method. In this way, the field plate electrode FP is formed so as to fill the inside of the trench TR1 and the inside of the trench TR2. At this point, upper surface position of the field plate electrode FP is higher than the upper surface position of the semiconductor substrate SUB.

Figure 20:
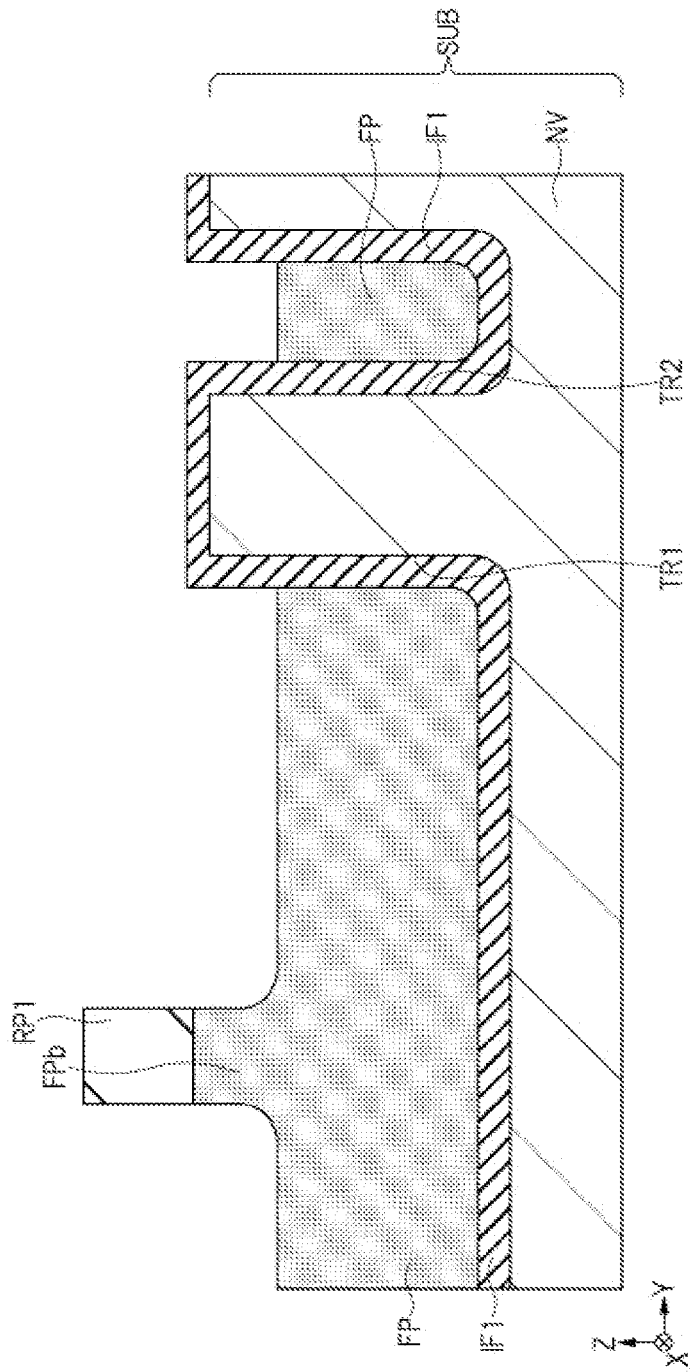
FIG. 20 is a cross-sectional view showing the manufacturing process of the semiconductor device following FIG. 18.
Figure 21:
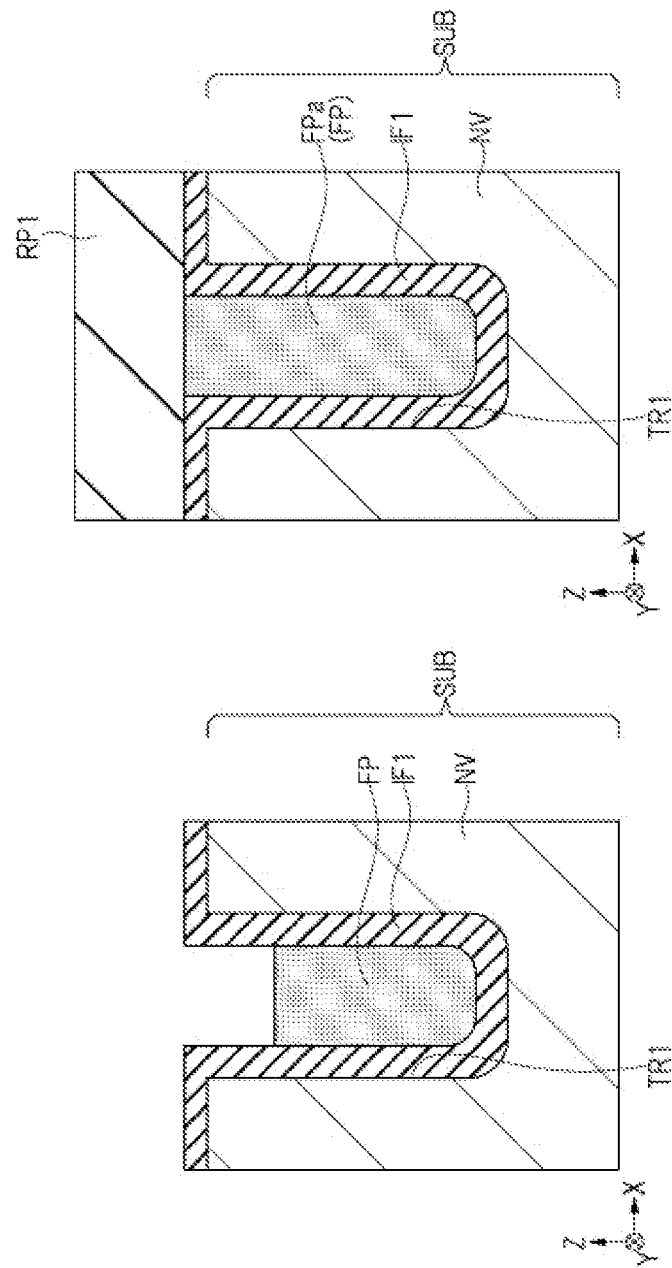
FIG. 21 is a cross-sectional view showing the manufacturing process of the semiconductor device following FIG. 19.

As shown in FIGS. 20 and 21, the other part of the field plate electrode FP is selectively retracted so that a portion of the field plate electrode FP is left as the contact portion FPa and the decoupling portion FPb. First, a resist pattern RP1 is formed to selectively cover the contact portions FPa and the regions to be the dividing portions FPb. Next, an anisotropic etch process is performed using the resist pattern RP1 as a mask to pattern the field plate FP. That is, the field plate electrodes FP other than the contact portions FPa and the dividing portions FPb are selectively retracted. Thereafter, the resist pattern RP1 is removed by performing an asking treatment.

Note that, as described above, the divided portion FPb of TR2 of the trench is not essential and may not be formed. However, if TR2 breaks FPb of the trench are not formed, the edge of the resist pattern RP1 extending in the X-direction is located between TR1 of the trench and TR2 of the trench. Since the end portions of the resist pattern RP1 are easily rounded during development, the shapes of the divided portions FPb of TR1 (TR1 of the outermost trenches) of the trenches closest to the trench TR2 are also easily rounded.

As a result, in TR1 of the outermost trench, a part of the field plate electrode FP to be the dividing portion FPb is retracted, and in a subsequent manufacturing process, there is a possibility that the conductive film CF2 is embedded at the retracted portion. That is, there is a possibility that the gate electrode GE and the floating gate electrode FG conduct through the conductive film CF2 at the receding position. Therefore, by forming the dividing portion FPb of the trench TR2 as a dummy pattern, the shape of the dividing portion FPb of the outermost trench TR1 is easily stabilized.

Figure 22:
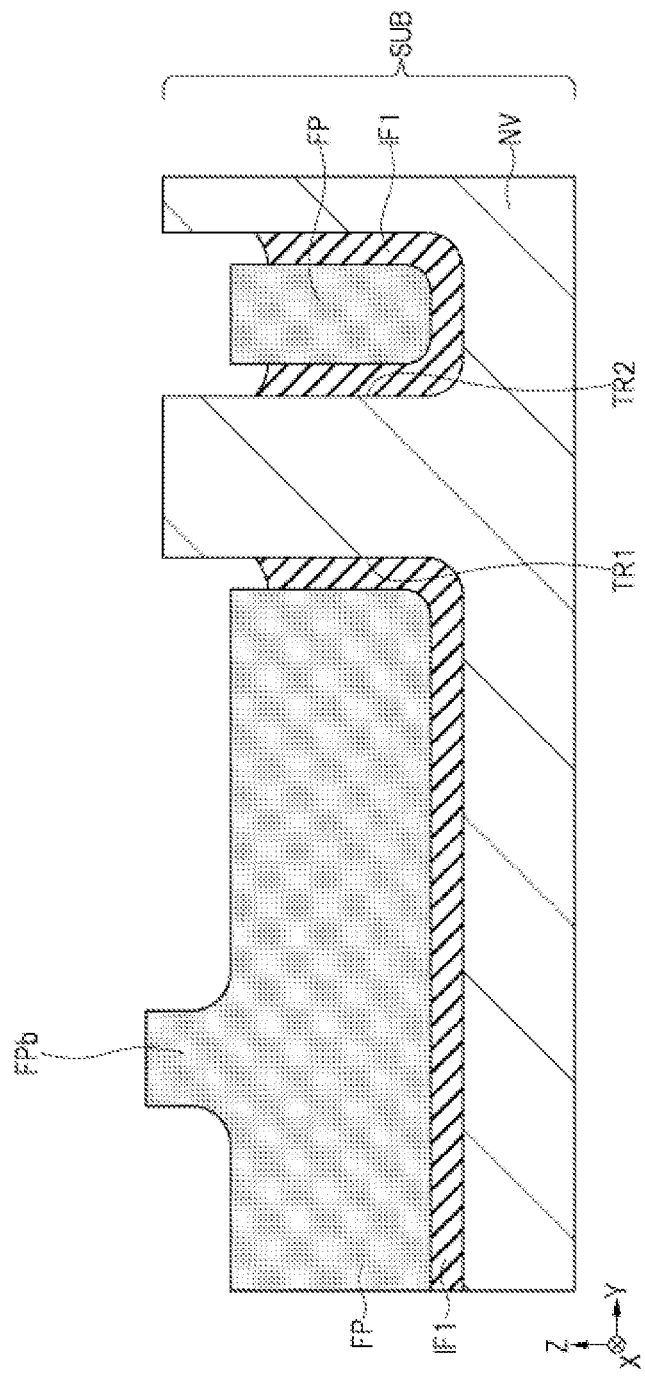
FIG. 22 is a cross-sectional view showing the manufacturing process of the semiconductor device following FIG. 20.
Figure 23:
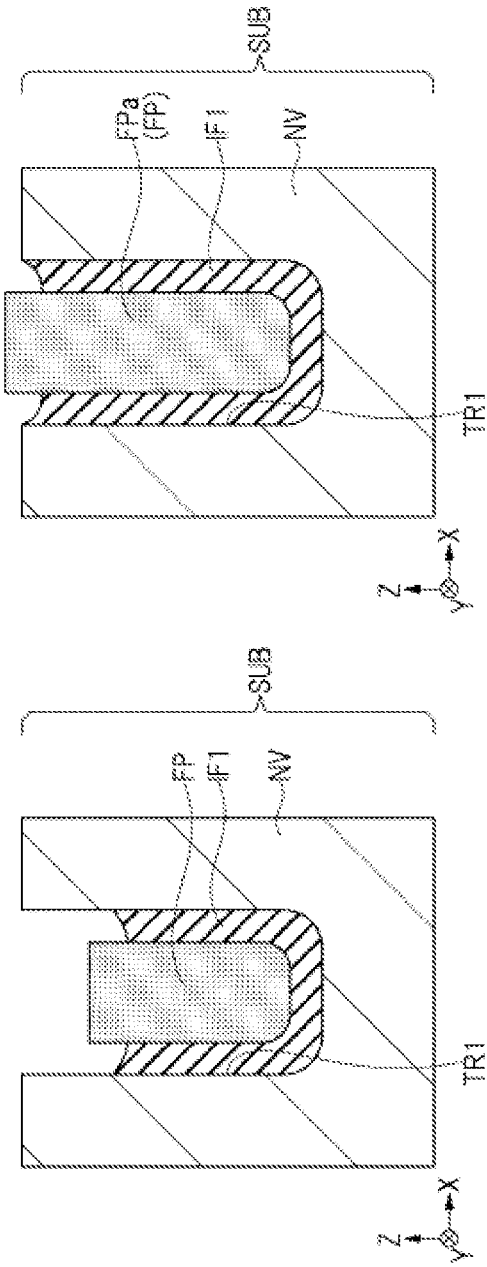
FIG. 23 is a cross-sectional view showing the manufacturing process of the semiconductor device following FIG. 21.

As shown in FIGS. 22 and 23, the insulating film IF1 is retracted inside the trench TR1 and inside the trench TR2 by, for example, a wet etching process using solutions containing hydrofluoric acid. As a result, the insulating film IF1 on the semiconductor substrate SUB is removed, and the position of the insulating film IF1 in the trench TR1 and the trench TR2 is lower than the position of the upper surface of the field plate FP.

At this point, the position of the upper surface of the insulating film IF1 in contact with the field plate electrode FP other than the contact portion FPa and the divided portion FPb is lower than the position of the upper surface of the insulating film IF1 in contact with the contact portion FPa and the divided portion FPb. In addition, by removing the insulating film IF1 on the semiconductor substrate SUB, the positions of the contact portion FPa and the dividing portion FPb in upper surface are higher than those of the semiconductor substrate SUB in upper surface.

Figure 24:
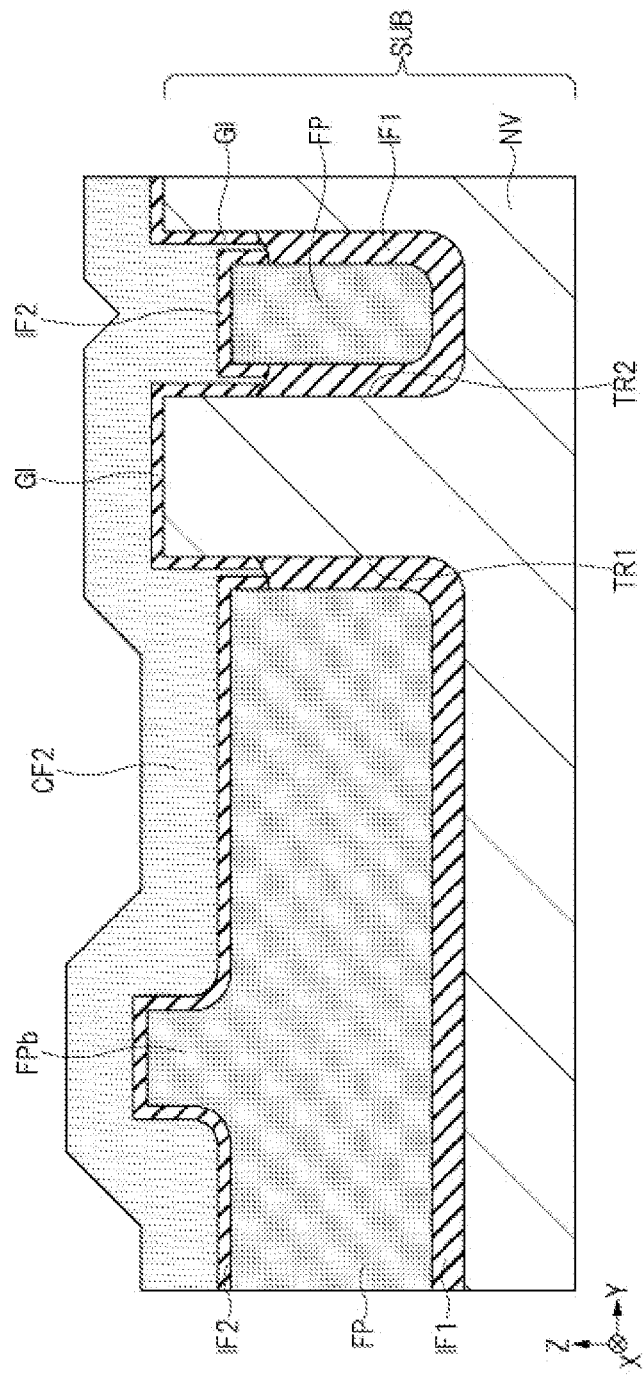
FIG. 24 is a cross-sectional view showing the manufacturing process of the semiconductor device following FIG. 22.
Figure 25:
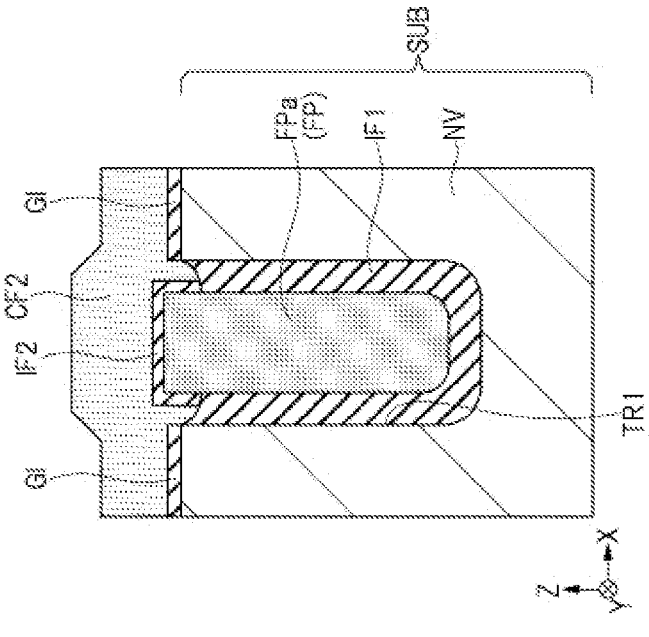
FIG. 25 is a cross-sectional view showing the manufacturing process of the semiconductor device following FIG. 23.
Figure 25:
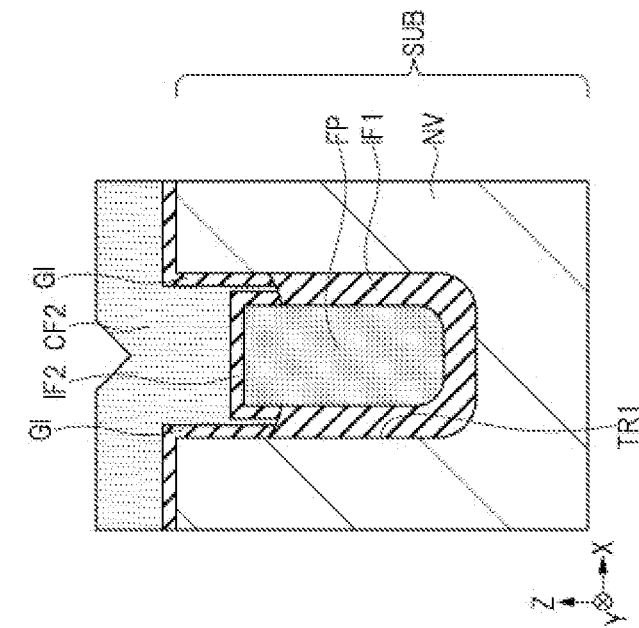

As shown in FIGS. 24 and 25, first, a gate insulating film GI made of, for example, a silicon oxide film is formed on the inside of the trench TR1 on the insulating film IF1, the inside of the trench TR2 on the insulating film IF1, and the semiconductor substrate SUB by a thermal oxidation method. At the same time, the insulating film IF2 is formed on upper surface and the side surface of the field plate electrode FP exposed from the insulating film IF1.

Next, a conductive film CF2 is formed on the semiconductor substrate SUB so as to cover the trench TR1 and the trench TR2, for example, by a CVD method. The conductive film CF2 is, for example, an n-type polycrystalline silicon film.

Figure 26:
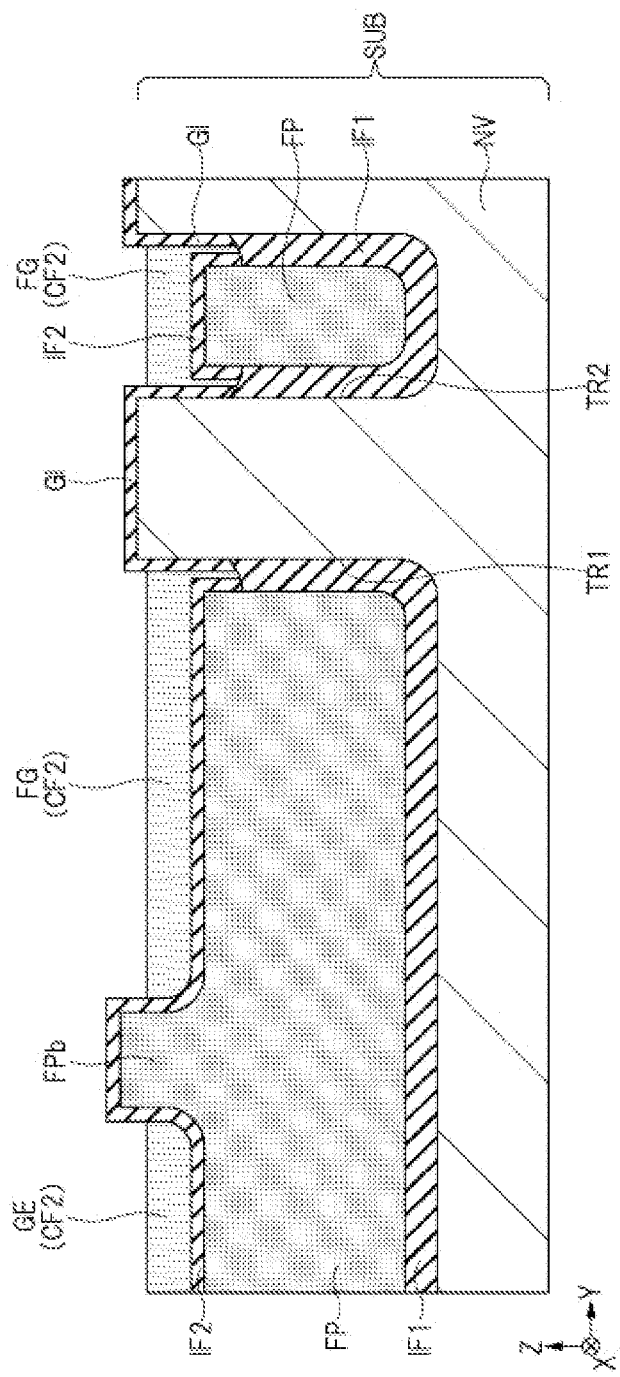
FIG. 26 is a cross-sectional view showing the manufacturing process of the semiconductor device following FIG. 24.
Figure 27:
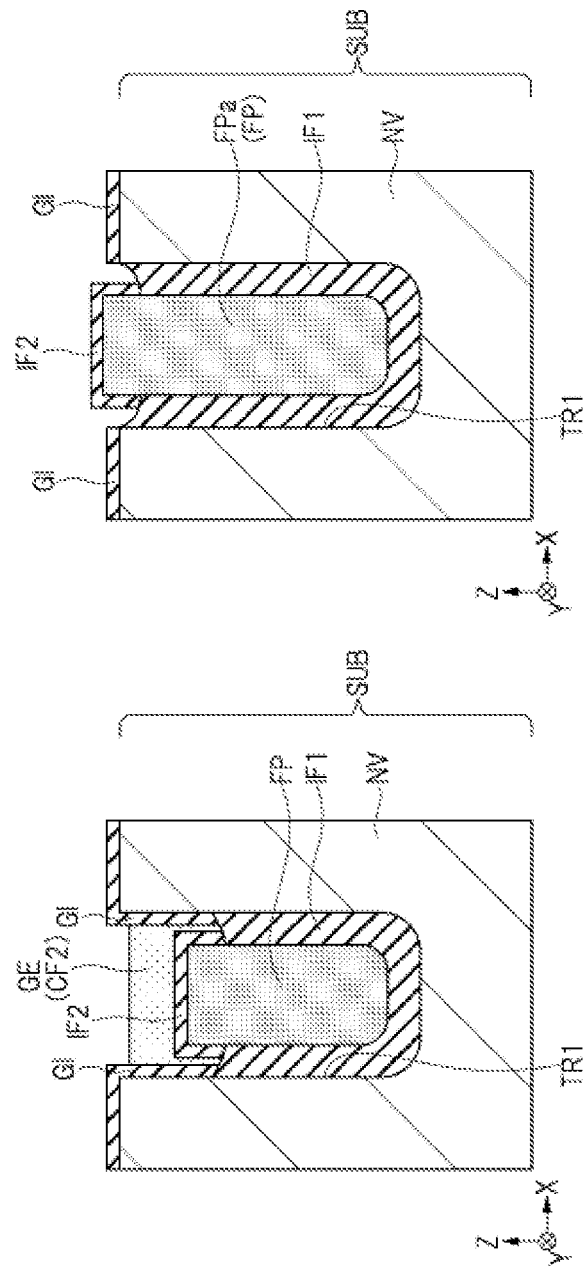
FIG. 27 is a cross-sectional view showing the manufacturing process of the semiconductor device following FIG. 25.

As shown in FIGS. 26 and 27, an anisotropic dry-etching process is performed on the conductive film CF2 to remove the conductive film CF2 formed outside the trench TR1 and outside the trench TR2. Accordingly, the gate electrode GE is formed so as to fill the inside of the trench TR1 on a part of the outer peripheral region OR and the field plate electrode FP of the cell region CR which are retreated in the manufacturing process of FIGS. 20 and 21. At the same time, the floating gate electrode FG is formed so as to fill the trench TR1 and the trench TR2 on the field plate electrode FP of the outer peripheral region OR.

By this anisotropic dry-etching process, the conductive film CF2 is removed inside the trench TR1 and the trench TR2 in which the contact portion FPa and the dividing portion FPb are formed. In order to completely remove the unwanted conductive film CF2, since the anisotropic dry etching process is performed by overetching, the position of upper surface of each of the gate electrode GE and the floating gate electrode FG is slightly lower than the position of upper surface of the semiconductor substrate SUB.

At this point, inside the trench TR1, the semiconductor substrate SUB, the gate electrode GE, the field plate electrode FP, and the floating gate electrode FG are insulated from each other. Inside the trench TR2, the semiconductor substrate SUB, the field plate electrode FP, and the floating gate electrode FG are insulated from each other.

Figure 28:
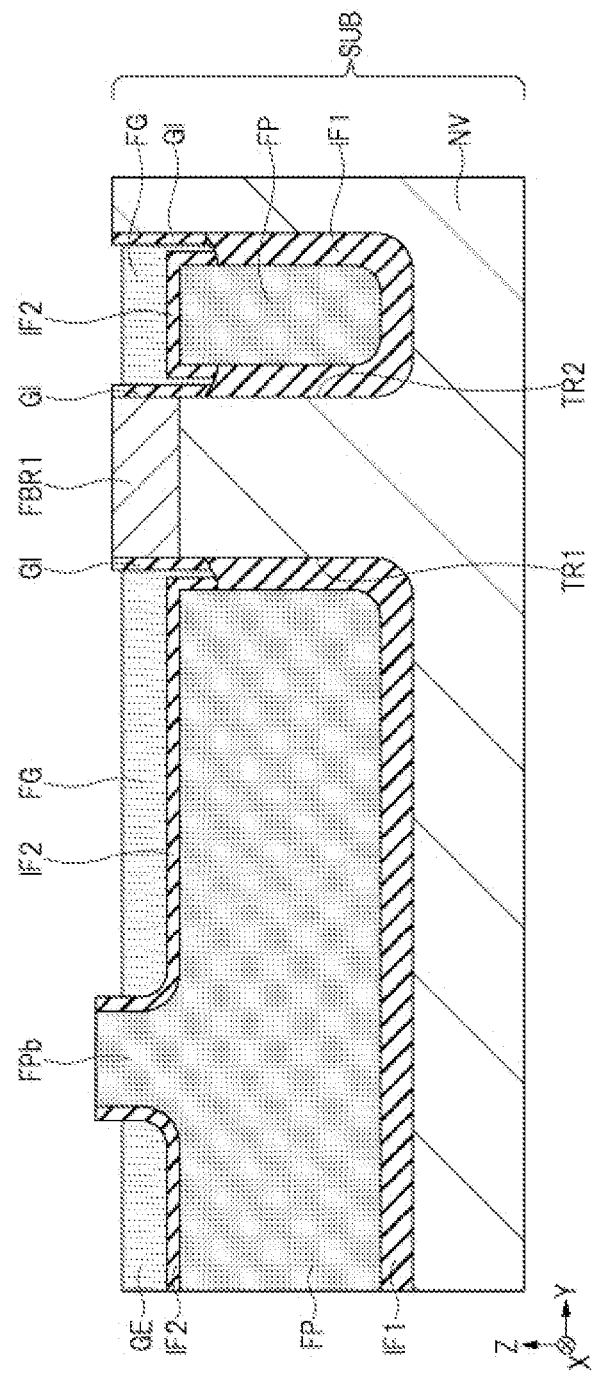
FIG. 28 is a cross-sectional view showing the manufacturing process of the semiconductor device following FIG. 26.
Figure 29:
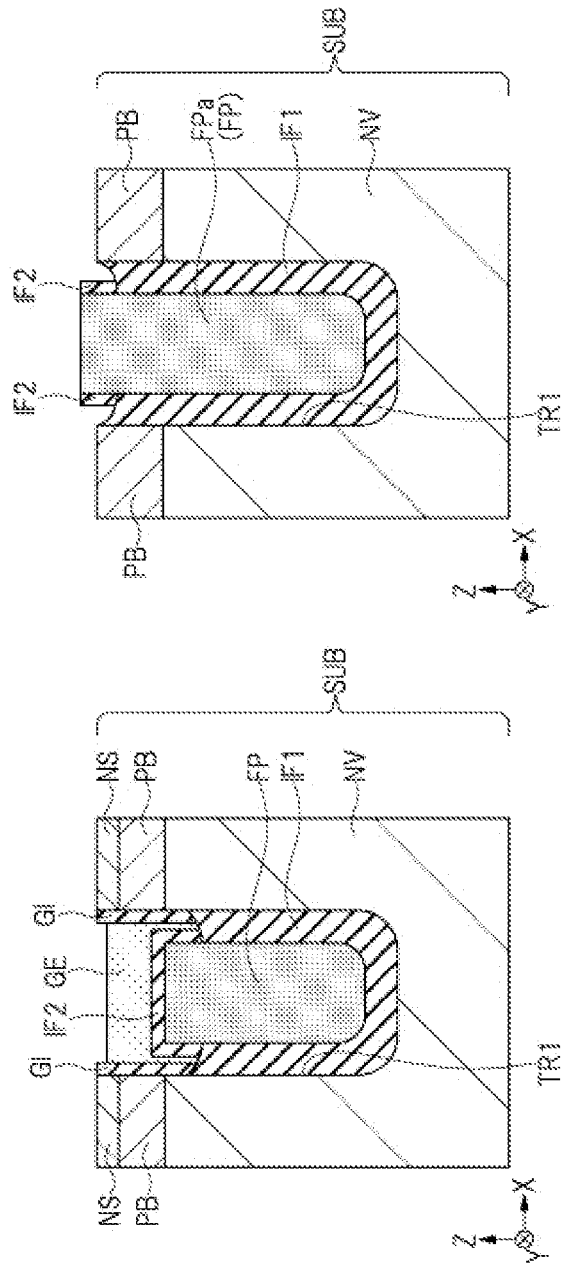
FIG. 29 is a cross-sectional view showing the manufacturing process of the semiconductor device following FIG. 27.

As shown in FIGS. 28 and 29, a p-type body region PB is selectively formed in a part of the outer peripheral region OR and the semiconductor substrate SUB of the cell region CR by introducing boron (B), for example, by a photolithography technique and an ion-implantation method on upper surface of the semiconductor substrate SUB, and a p-type floating region FBR1~FBR3 is selectively formed in the semiconductor substrate SUB of the outer peripheral region OR. The body region PB and the floating region FBR1~FBR3 are formed to be shallower than the depth of the trench TR1 and the trench TR2.

Next, an n-type source region NS is selectively formed in the body region PB of the cell region CR by introducing, for example, arsenic (As) by photolithography and ion-implantation. Thereafter, the semiconductor substrate SUB is subjected to a heat treatment to diffuse impurities contained in the source region NS, the body-region PB, and the floating region FBR1~FBR3.

Note that a thin silicon oxide film may be formed as a through film on the semiconductor substrate SUB prior to the ion-implantation. The through film may be removed after the ion-implantation, or may be left as a part of the interlayer insulating film IL.

Figure 30:
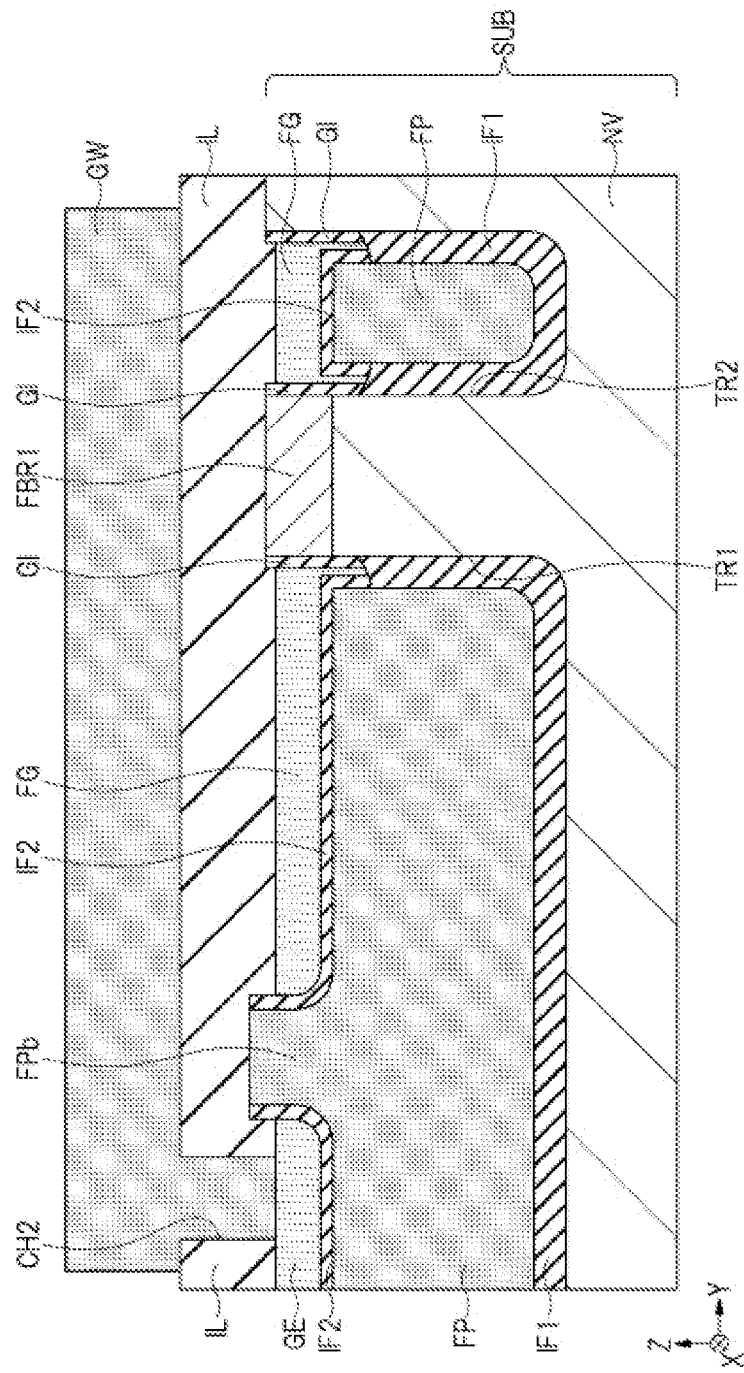
FIG. 30 is a cross-sectional view showing the manufacturing process of the semiconductor device following FIG. 28.
Figure 31:
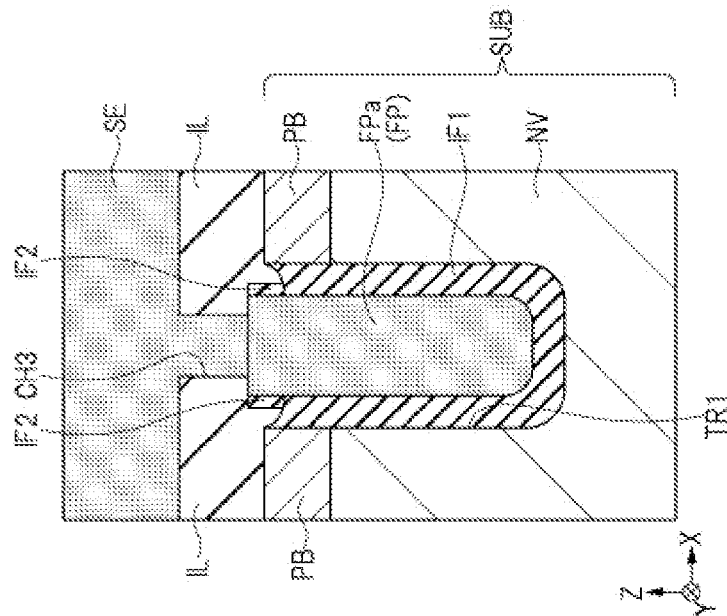
FIG. 31 is a cross-sectional view showing the manufacturing process of the semiconductor device following FIG. 29.
Figure 31:
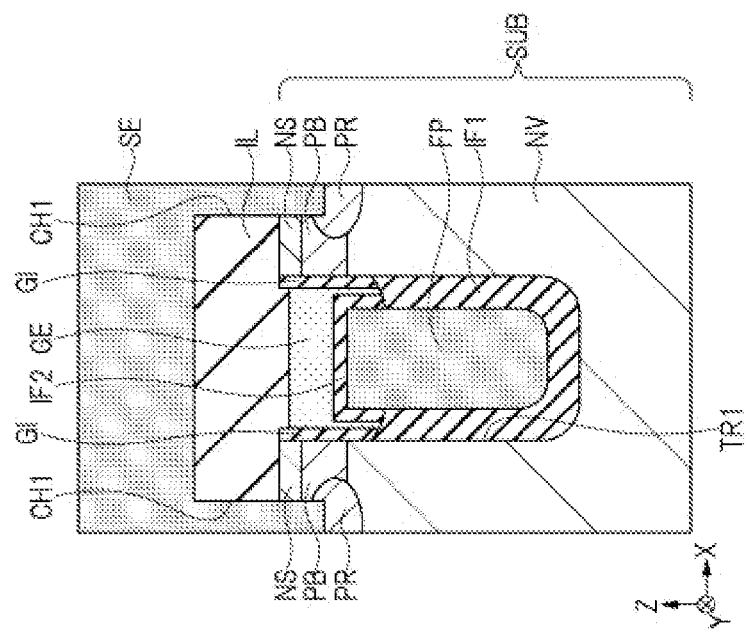

As shown in FIGS. 30 and 31, an interlayer insulating film IL is formed on the upper surface of the semiconductor substrate SUB of the cell region CR and the outer peripheral region OR by, for example, a CVD method so as to cover the trench TR1 and the trench TR2. The interlayer insulating film IL is formed of, for example, a silicon oxide film. The interlayer insulating film IL may be a laminated film of a thin silicon oxide film formed by a CVD method and a PSG film formed by a coating method.

Next, a hole CH1~CH4 is formed in the interlayer insulating film IL. First, on the interlayer insulating film IL, a resist pattern having a pattern for opening the semiconductor substrate SUB in which the source region NS is formed is formed. Next, an anisotropic etch process is performed using the resist pattern as a mask to form a hole CH1 that reaches the source region NS and the body region PB in the interlayer insulating film IL. The bottom of the hole CH1 is located in the body area PB. Next, a p-type highly diffused region PR is formed by introducing, for example, boron (B) into the body region PB at the bottom of the hole CH1 by the ion-implantation method. Thereafter, the resist pattern is removed by performing an asking treatment.

Next, on the interlayer insulating film IL, a resist pattern having a pattern opening on the gate electrode GE of the outer peripheral region OR, on the contact portion FPa of the trench TR1, and on the contact portion FPa of the trench TR2 is formed. Next, an anisotropic etching process is performed using the resist pattern as a mask to form a hole CH2 reaching the gate electrode GE, a hole CH3 reaching the contact portion FPa of the trench TR1, and a hole CH4 reaching the contact portion FPa of the trench TR2 in the interlayer insulating film IL. Thereafter, the resist pattern is removed by performing an asking treatment.

Note that either the step of forming the hole CH1 or the step of forming the hole CH2~CH4 may be performed first. In addition, a hole CH1~CH4 may be simultaneously formed in the interlayer insulating film IL.

Next, the source electrode SE and the gate wiring GW surrounding the source electrode SE in a plan view are formed on the interlayer insulating film IL. First, a stacked film of a barrier metal film made of, for example, a titanium nitride film and a conductive film made of, for example, an aluminum film is formed on the interlayer insulating film IL by a sputtering method or a CVD method. Next, the stacked film is patterned to form the source electrode SE and the gate wiring GW.

The gate wiring GW is embedded in the hole CH2 and electrically connected to the gate electrode GE. The source electrode SE is embedded in the hole CH1, the hole CH3, and the hole CH4, and is electrically connected to the source region NS, the body region PB, the highly diffused region PR, and the field plate electrode FP.

Note that the source electrode SE and the gate wiring GW may include a plug-layer filling the inside of the hole CH1~CH4 and a wiring layer formed on the interlayer insulating film IL. First, a first barrier metal film made of, for example, a titanium nitride film is formed on the inside of the hole CH1~CH4 and the interlayer insulating film IL by a sputtering method or a CVD method. Next, a first conductive film made of, for example, a tungsten film is formed on the first barrier metal film by a CVD method. Next, the first barrier metal film and the first conductive film formed outside the hole CH1~CH4 are removed by a CMP method or an anisotropic etch process. As a result, the first barrier metal film and the first conductive film are formed so as to fill the inside of the hole CH1~CH4.

Next, a stacked film of a second barrier metal film made of, for example, a titanium nitride film and a second conductive film made of, for example, an aluminum film is formed on the interlayer insulating film IL by a sputtering method or a CVD method. Next, the stacked film is patterned to form a wiring layer electrically connected to the plug layer.

Next, although not illustrated here, a protective film made of, for example, a polyimide film is formed on the source electrode SE and the gate wiring GW by, for example, a coating method. By forming an opening in a part of the protective film, regions of the source electrode SE and the gate wiring GW that become the source pad SP and the gate pad GP are exposed.

Thereafter, the semiconductor device 100 shown in FIGS. 4 to 6 is manufactured through the following manufacturing steps. First, the lower surface of the semiconductor substrate SUB is polished as needed. Next, an n-type drain region ND is formed by introducing, for example, arsenic (As) or the like into the lower surface of the semiconductor substrate SUB of the cell region CR and the outer peripheral region OR by ion-implantation. Next, the drain electrode DE is formed under the lower surface of the semiconductor substrate SUB in the cell region CR and the outer peripheral region OR by a sputtering method.

Note that the source electrode SE, the gate wiring GW, and the drain electrode DE are not electrically connected to the floating area FBR1~FBR3 and the floating gate electrode FG.

In the method of manufacturing the semiconductor device 100 according to the first embodiment, the floating area FBR1~FBR3 and the floating gate electrode FG can be formed without adding a manufacturing process as compared with the first examined example and the second examined example. Manufacturing costs can be suppressed from increasing.

That is, the floating region FBR1~FBR3 can be formed together with the body region PB only by changing the opening pattern of the mask for forming the body region PB in the manufacturing process of FIGS. 28 and 29. In the manufacturing process of FIGS. 20 and 21, the field plate electrode FP at the floating gate electrode FG can be retracted only by changing the opening pattern of the resist pattern RP1. In the manufacturing process of FIGS. 24 to 27, the floating gate electrode FG can also be formed together with the gate electrode GE from the same conductive film CF2.

Second Embodiment

Figure 32:
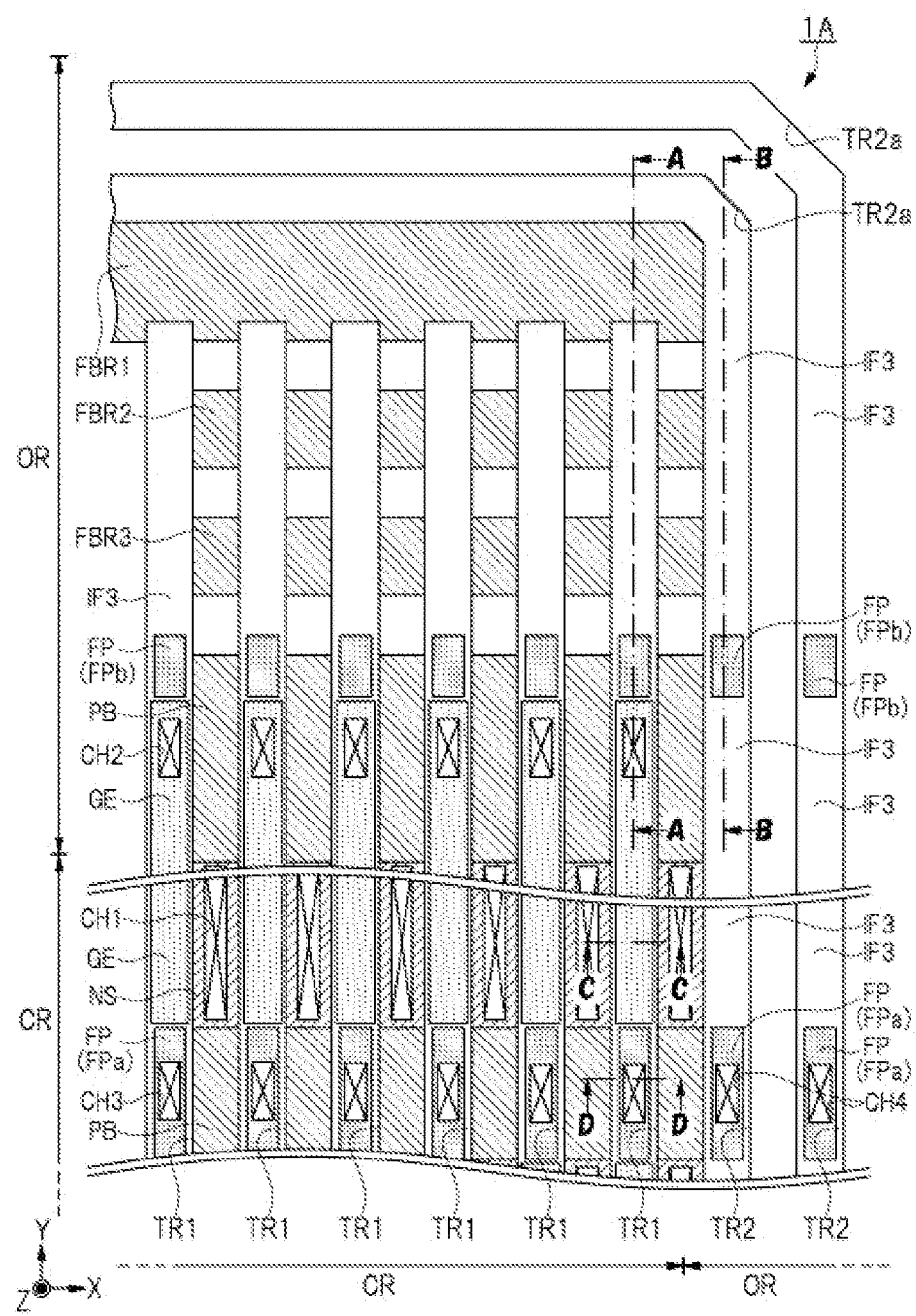
FIG. 32 is an enlarged plan view showing a main portion of a semiconductor device according to a second embodiment.
Figure 33:
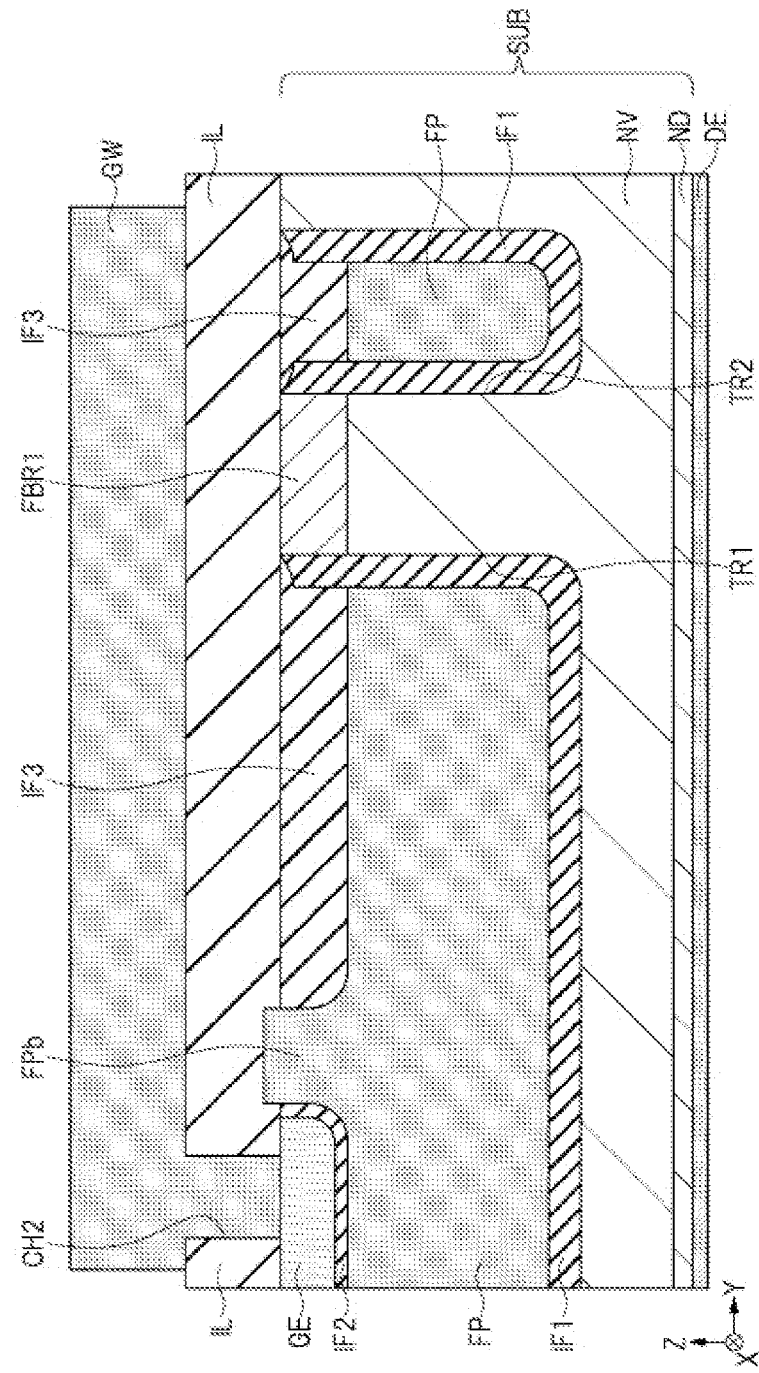
FIG. 33 is a cross-sectional view showing the semiconductor device according to the second embodiment.
Figure 34:
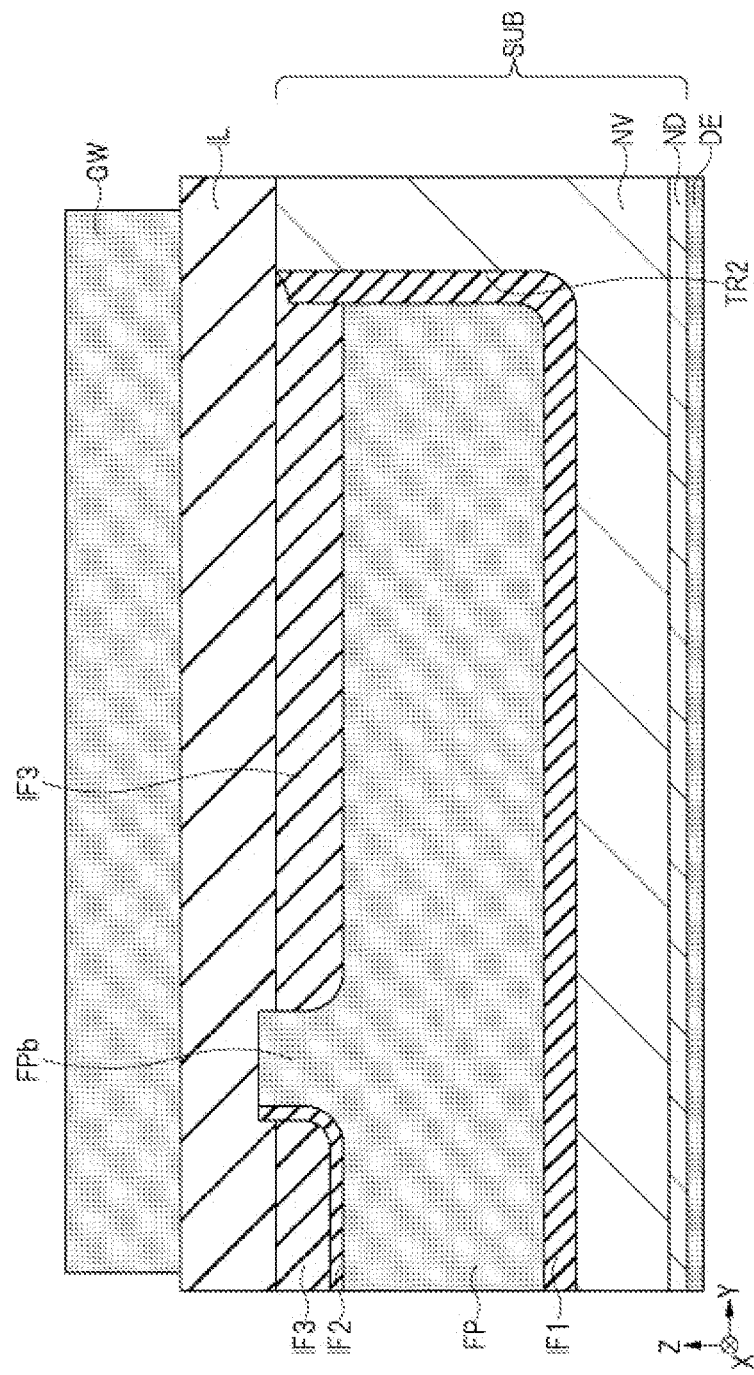
FIG. 34 is a cross-sectional view showing the semiconductor device according to the second embodiment.

A semiconductor device 100 in the second embodiment will be described below with reference to FIG. 32 to FIG. 34. Note that, in the following description, differences from the first embodiment will be mainly described, and the description of overlapping points with the first embodiment will be omitted. FIG. 33 is a cross-sectional view along line A-A shown in FIG. 32. FIG. 34 is a cross-sectional view along B-B shown in FIG. 32. Note that cross-sectional view along C-C line and D-D line shown in FIG. 32 is the same as that in FIG. 6, and thus the explanation thereof will be omitted.

In the second embodiment, an insulating film IF3 is formed in a position where the floating gate electrode FG of the first embodiment is formed, instead of the floating gate electrode FG. That is, as shown in FIGS. 32 to 34, inside the trench TR1 of the outer peripheral region OR, the upper portion of the trench TR1 is embedded with the insulating film IF3. Also, inside the trench TR2, the upper portion of the trench TR2 is embedded with the insulating film IF3.

Also in the second embodiment, inside the trench TR1, the semiconductor substrate SUB, the gate electrode GE and the field plate electrode FP are insulated from one another. Also, inside the trench TR2, the semiconductor substrate SUB and the field plate FP are insulated from each other.

Referring to FIG. 11 and Equation 1, it can be seen that the capacitance CφCFP and the capacitance CφTFP are also very small in second embodiment. Therefore, even in the second embodiment, the potential φFBR of the floating area FBR1 can be increased to approximately the same level as that of the first embodiment.

The insulating film IF3 may be, for example, a single layer film of a silicon oxide film, a silicon nitride film, or a silicon oxynitride film, or a stacked film obtained by appropriately stacking these films. However, from the viewpoint that the capacitance CφCFP and the capacitance CφTFP are preferable smaller, the insulating film IF3 is preferably formed of an insulating film having a small relative dielectric constant. Therefore, a single layer film of a silicon oxide film is applied to the insulating film IF3.

Figure 35:
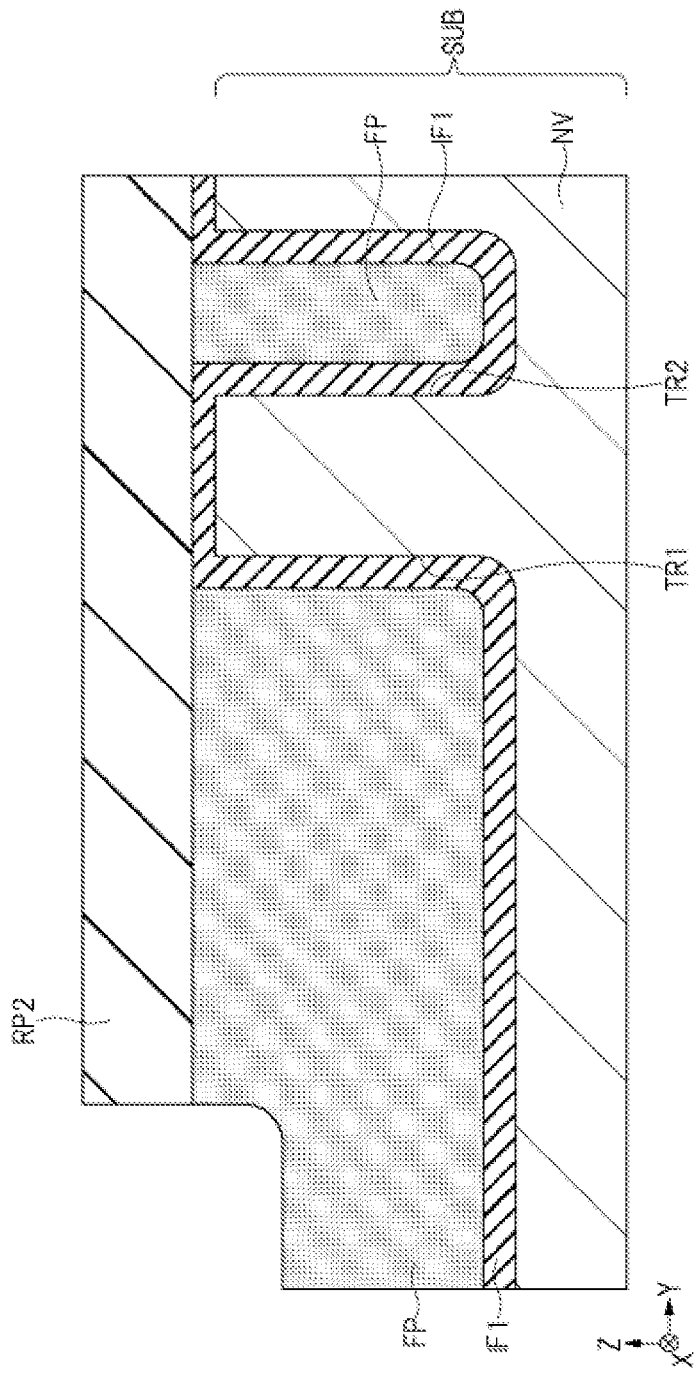
FIG. 35 is a cross-sectional view showing a manufacturing process of the semiconductor device according to the second embodiment.

The method of manufacturing the semiconductor device 100 according to the second embodiment will be described below with reference to FIG. 35 to FIG. 40. The manufacturing process of the second embodiment is the same as that of the first embodiment up to the manufacturing process of FIG. 18. FIG. 35 shows the manufacturing process subsequent to FIG. 18.

As shown in FIG. 35, inside the trench TR1, the field plate electrode FP is selectively retracted so that a portion of the field plate electrode FP remains as a contact portion FPa in the outer peripheral region OR and the cell region CR. First, a resist pattern RP2 having a pattern in which a portion to be a gate electrode GE is opened is formed. Next, an anisotropic etch process is performed using the resist pattern RP2 as a mask to pattern the field plate FP. Thereafter, the resist pattern RP2 is removed by performing an asking treatment.

Figure 36:
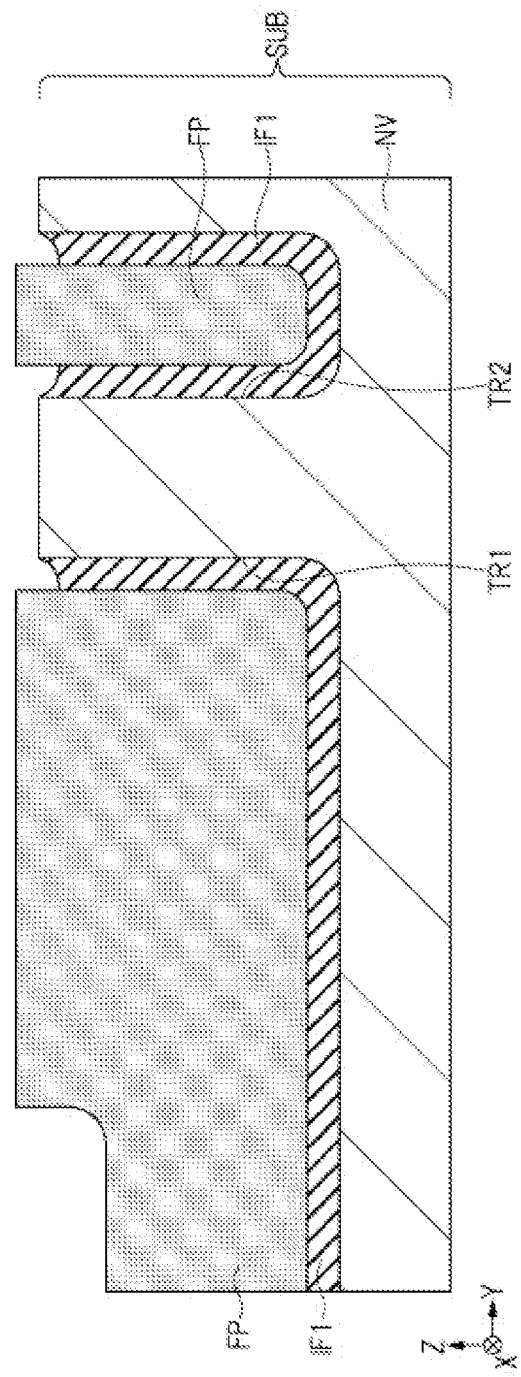
FIG. 36 is a cross-sectional view showing the manufacturing process of the semiconductor device following FIG. 35.

As shown in FIG. 36, the insulating film IF1 is retracted inside the trench TR1 and inside the trench TR2 by, for example, a wet etching process using solutions containing hydrofluoric acid. As a result, the insulating film IF1 on the semiconductor substrate SUB is removed, and the position of the insulating film IF1 in the trench TR1 and the trench TR2 is lower than the position of the upper surface of the field plate FP.

Figure 37:
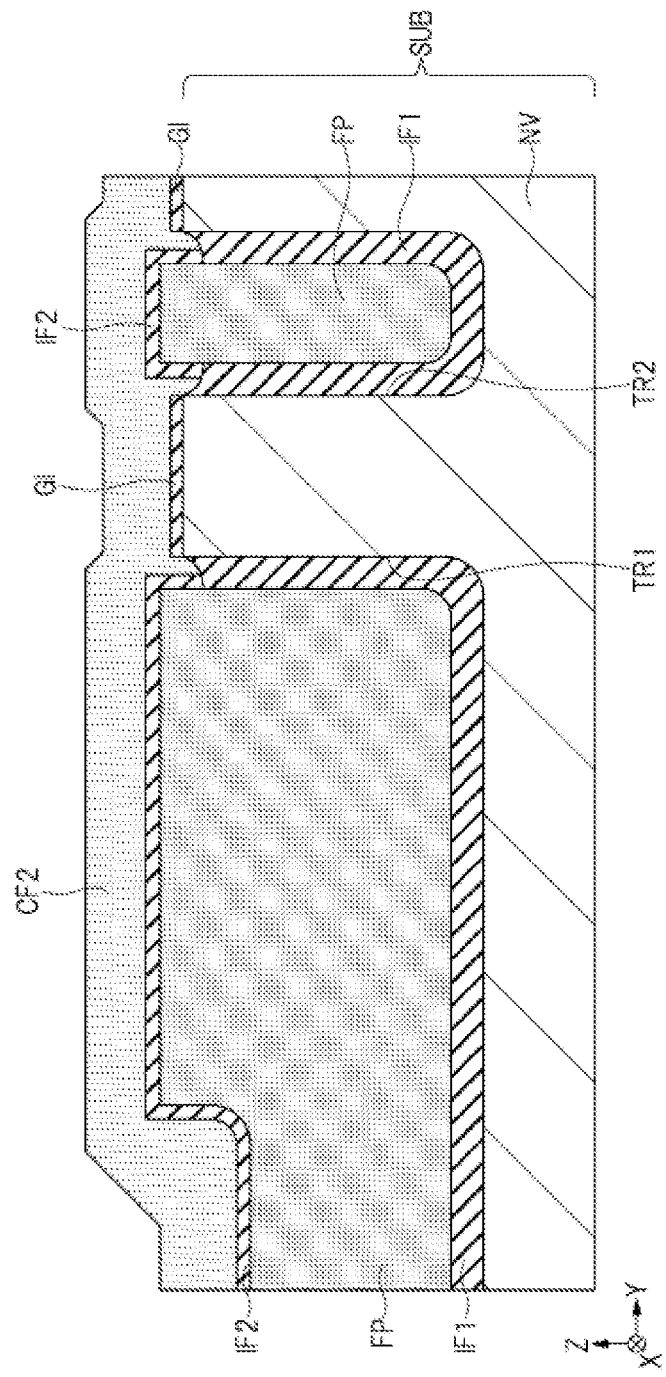
FIG. 37 is a cross-sectional view showing the manufacturing process of the semiconductor device following FIG. 36.

As shown in FIG. 37, first, a gate insulating film GI made of, for example, a silicon oxide film is formed on the inside of the trench TR1 on the insulating film IF1, the inside of the trench TR2 on the insulating film IF1, and the semiconductor substrate SUB by a thermal oxidation method. At the same time, the insulating film IF2 is formed on upper surface and the side surface of the field plate electrode FP exposed from the insulating film IF1. Next, a conductive film CF2 is formed on the semiconductor substrate SUB so as to cover the trench TR1 and the trench TR2, for example, by a CVD method.

Figure 38:
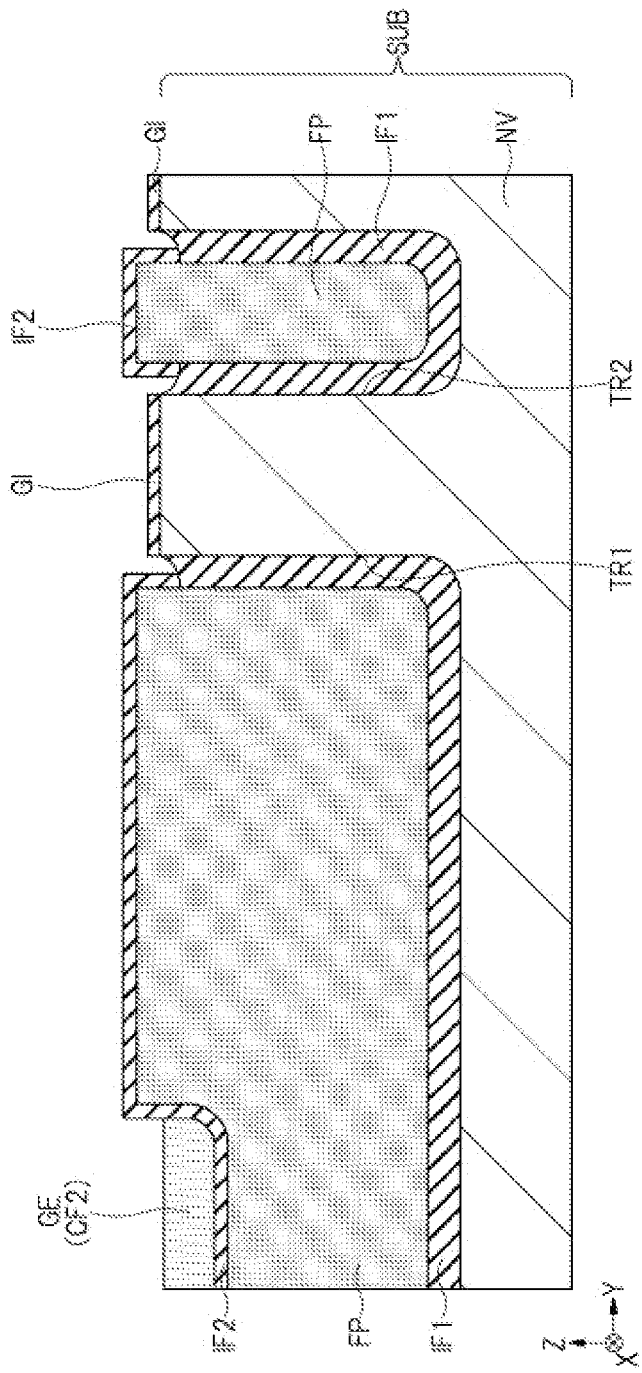
FIG. 38 is a cross-sectional view showing the manufacturing process of the semiconductor device following FIG. 37.

As shown in FIG. 38, an anisotropic dry-etching process is performed on the conductive film CF2 to remove the conductive film CF2 formed outside the trench TR1 and outside the trench TR2. Accordingly, the gate electrode GE is formed so as to fill the inside of the trench TR1 on a part of the outer peripheral region OR and the field plate electrode FP of the cell region CR which are retreated in the manufacturing process of FIG. 35. Since the anisotropic dry etching process is performed by overetching, the position of upper surface of the gate electrode GE is slightly lower than the position of upper surface of the semiconductor substrate SUB.

Figure 39:
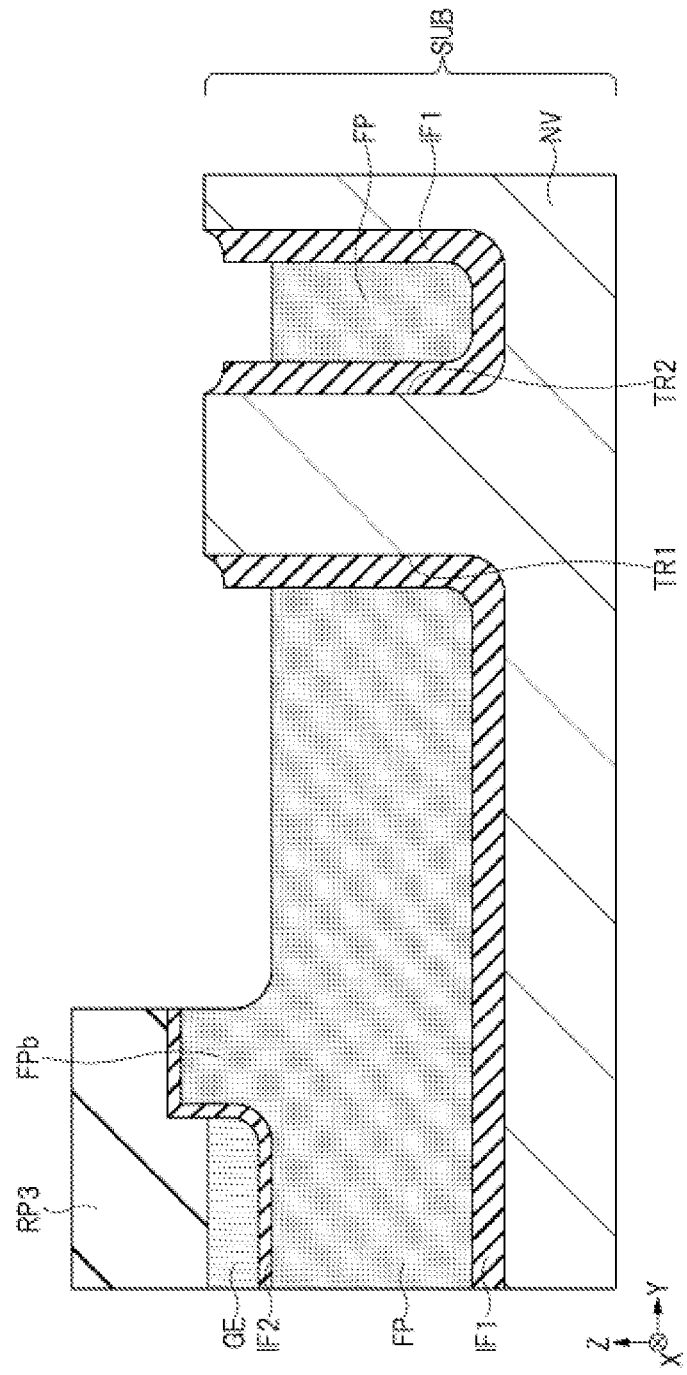
FIG. 39 is a cross-sectional view showing the manufacturing process of the semiconductor device following FIG. 38.

As shown in FIG. 39, first, a resist pattern RP3 is formed so as to cover a part of the outer peripheral region OR, a trench TR1 of the cell region CR, and a part of the trench TR2. Next, an anisotropic etch process is performed using the resist pattern RP3 as a mask to pattern the field plate FP. Thus, in the trench TR1, the field plate electrode FP of the outer peripheral region OR is selectively retracted so that a portion of the field plate electrode FP is left as the cut-off portion FPb. At the same time, in the trench TR2, the other part of the field plate electrode FP is selectively retracted so that a part of the field plate electrode FP is left as the contact part FPa and the dividing part FPb. Thereafter, the resist pattern RP3 is removed by performing an asking treatment.

Figure 40:
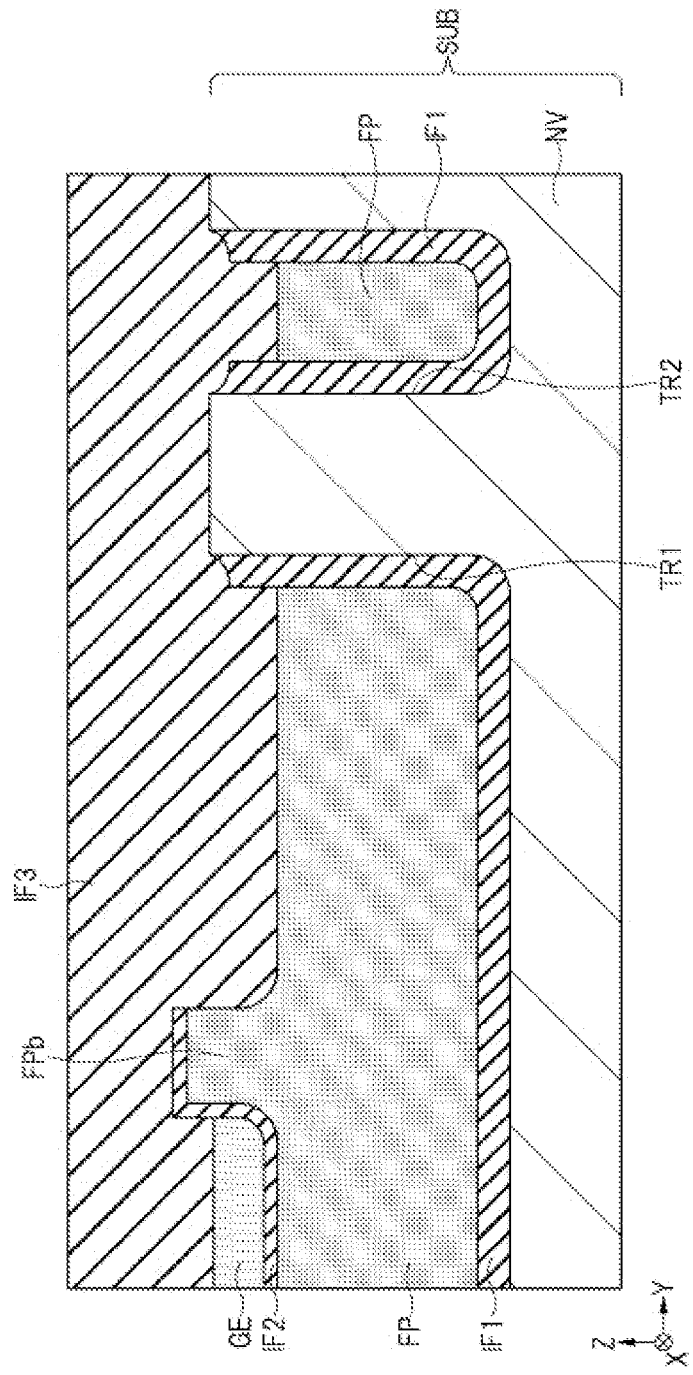
FIG. 40 is a cross-sectional view showing the manufacturing process of the semiconductor device following FIG. 39.

As shown in FIG. 40, an insulating film IF3 is formed on the upper surface of the semiconductor substrate SUB by, for example, a CVD method so as to cover the trench TR1 and the trench TR2.

Figure 41:
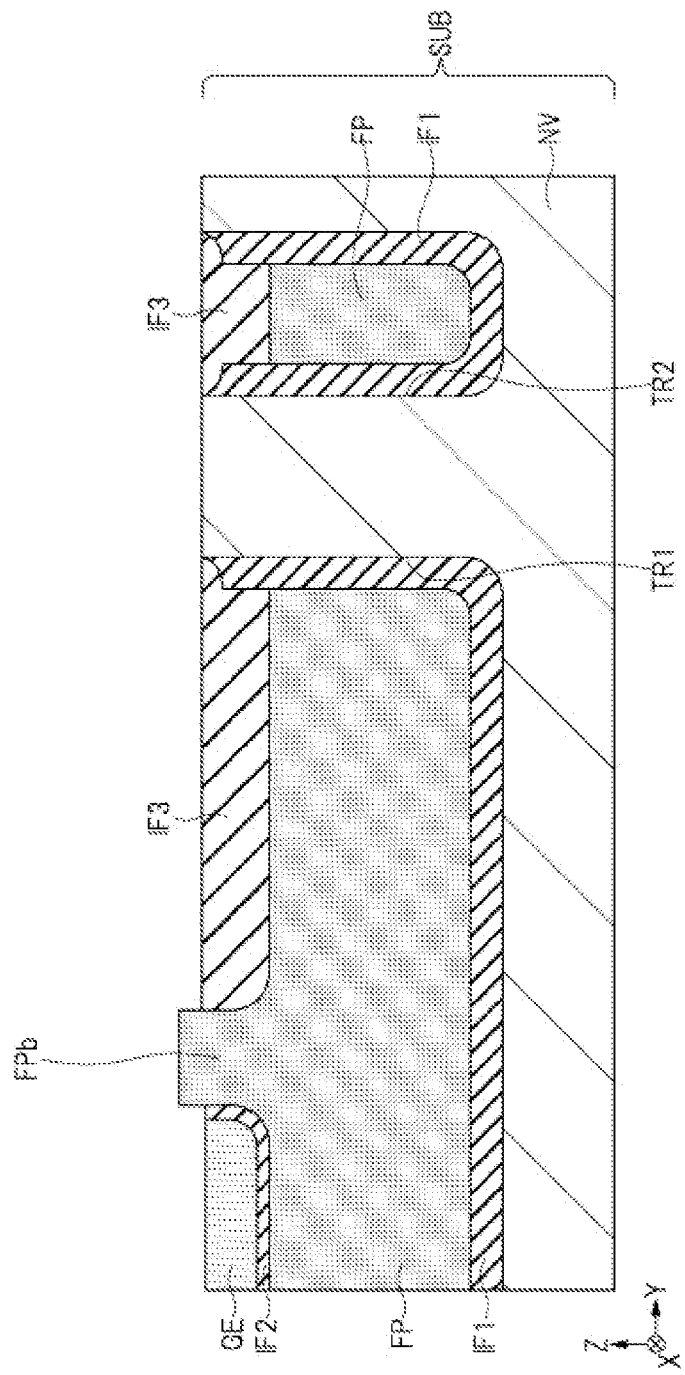
FIG. 41 is a cross-sectional view showing the manufacturing process of the semiconductor device following FIG. 40.

As shown in FIG. 41, the insulating film IF3 on the upper surface of the semiconductor substrate SUB is removed by performing an anisotropic etch process on the insulating film IF3. As a result, in the trench TR1, the insulating film OR is formed so as to fill the inside of the trench FP on the field plate electrode of the outer peripheral region FP which is retreated in the manufacturing process of FIG. 39. Inside the trench TR2, an insulating film OR is formed so as to fill the inside of the trench FP on the field plate electrode of the outer peripheral region FP which is retreated in the manufacturing process of FIG. 39.

The subsequent manufacturing process is the same as the manufacturing process of FIG. 28 and subsequent steps.

Third Embodiment

A semiconductor device in the third embodiment will be described below with reference to FIG. 42. Note that, in the following description, differences from the first embodiment will be mainly described, and the description of overlapping points with the first embodiment will be omitted.

Figure 42:
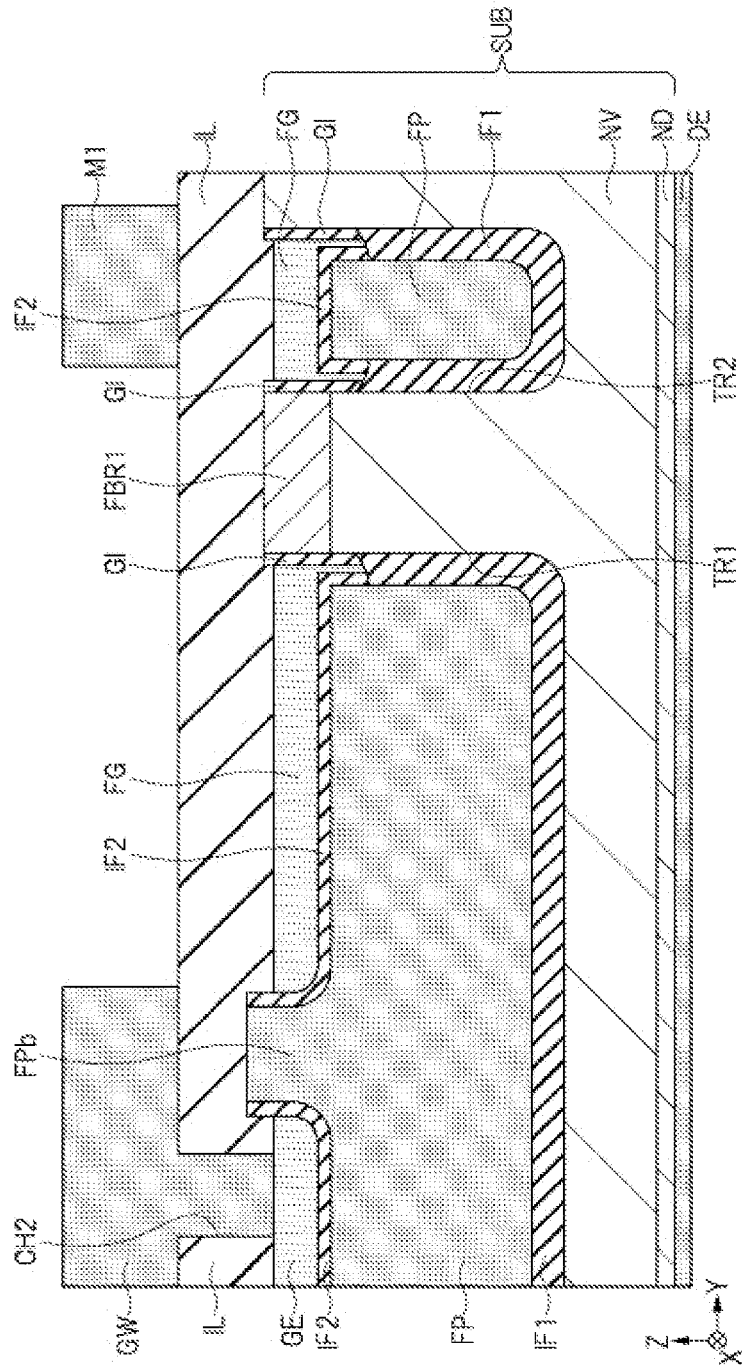
FIG. 42 is a plan view showing a semiconductor device according to the third embodiment.

As shown in FIG. 42, in the third embodiment, the source electrode SE and the gate wiring GW are formed on the interlayer insulating film IL so as not to overlap with the floating regions FBR1 in a plan view. In other words, in the cross-sectional view, the floating regions FBR1 are not formed directly below the source electrode SE and the gate wiring GW.

Further, although not shown here, when a plurality of floating regions FBR such as the floating region FBR2 and the floating region FBR3 are provided in addition to the floating region FBR1, the plurality of floating regions FBR are also formed so as not to overlap with the source electrode SE and the gate wiring GW in plan view.

Referring to FIG. 11 and Equation 1, the third embodiment considers that not only the capacitance $C\phi CFP$ and the capacitance $C\phi TFP$ but also the capacitance $C\phi GW$ are very small. Consequently, the potential $\phi FBR$ of the floating area FBR1 can be further increased as shown in the graph of FIG. 13.

In order to realize the third embodiment technique, the arrangement of the source electrode SE and the gate wiring GW may be changed to such an extent that the source electrode SE is located on the hole CH1, the hole CH3, and the hole CH4, and the gate wiring GW is located on the hole CH2.

In addition, other interconnect M1 may be formed in the interlayer insulating film IL as long as they do not overlap with the floating regions FBR1~FBR3 in plan view. For example, as shown in FIG. 42, a wiring M1 may be formed so as to further surround the outer periphery of the gate wiring GW. Such a wiring M1 may be a wiring for supplying a predetermined potential such as a gate potential, a source potential, or a drain potential, or may be a floating dummy wiring.

Although not illustrated in the present application, a protective film such as a polyimide film is formed on the source electrode SE and the gate wiring GW. By providing the wiring M1 on the outer periphery of the gate wiring GW, the planarity of the protective film can be improved in the vicinity of the outermost periphery of the semiconductor device 100.

Note that the technique disclosed in the third embodiment can also be applied to the second embodiment. Even in this case, the same effect can be obtained.

Although the present invention has been described in detail based on the above-described embodiments, the present invention is not limited to the above-described embodiments, and can be variously modified without departing from the gist thereof.

In addition, some of the contents described in the above embodiment mode will be described below.

Additional Statement 1

A method of manufacturing a semiconductor device including: a cell region in which a MOSFET is formed; and an outer peripheral region surrounding the cell region in plan view, comprising steps of:
(a) providing a semiconductor substrate of a first conductivity type, the semiconductor substrate having an upper surface and a lower surface;
(b) after the step of (a), forming a first trench in each of the semiconductor substrate located in the cell region and the semiconductor substrate located in the outer peripheral region, and forming a second trench in the semiconductor substrate located in the outer peripheral region, the first trench extending in a first direction in plan view, and the second trench extending in each of the first direction and a second direction perpendicular to the first direction in plan view so as to surround the cell region in plan view;
(c) after the step of (b), forming a first field plate electrode such that an inside of the first trench is embedded with the first filed plate electrode, and forming a second field plate electrode such that an inside of the second trench is embedded with the second filed plate electrode;
(d) after the step of (c), selectively retracting a first another portion of the first field plate electrode such that a one portion of the first field plate electrode is left as a first contact portion;
(e) after the step of (d), forming a gate electrode on the first field plate electrode located in each of the cell region and a first portion of the outer peripheral region such that the inside of the first trench is embedded with the gate electrode;
(f) after the step of (e), selectively retracting a second another portion of the first field plate electrode, and selectively retracting an another portion of the second field plate electrode such that a one portion of the second field plate electrode is left as a second contact portion;
(g) after the step of (f), forming a first insulating film on the first field plate electrode located in a third portion of the outer peripheral region such that the inside of the first trench is embedded with the first insulating film, and forming a second insulating film on the second field plate electrode such that the inside of the second trench is embedded with the second insulating film;
(h) after the step of (g), forming a body region in each of the semiconductor substrate located in the cell region and the semiconductor substrate located in a second portion of the outer peripheral region, and forming a first floating region in the semiconductor substrate located in the outer peripheral region, the body region being a region of a second conductivity type opposite the first conductivity type, the first floating region being a region of the second conductivity type; and
(i) after the step of (h), forming a source region in the body region located in the cell region, the source region being a region of the first conductivity type,
wherein a depth of each of the body region and the first floating region is shallower than a depth of each of the first trench and the second trench,
wherein the first floating region is located between the first trench located in the outer peripheral region and the second trench extending in the second direction such that the first floating region is spaced apart from the body region, wherein the semiconductor substrate, the gate electrode and the first field plate electrode are insulated from one another, and wherein the semiconductor substrate and the second field plate electrode are insulated from each other.

Additional Statement 2

The method according to the additional statement 1, further comprising steps of:
(j) after the step of (i), forming an interlayer insulating film on the upper surface of the semiconductor substrate located in each of the cell region and the outer peripheral region so as to cover each of the first trench and the second trench;
(k) after the step of (j), in the interlayer insulating film, forming a first hole, a second hole, a third hole and a fourth hole;
(l) after the step of (k), forming a source electrode on the interlayer insulating film, and forming a gate wiring on the interlayer insulating film so as to surround the source electrode in plan view; and
(m) after the step of (l), forming a drain electrode on the lower surface of the semiconductor substrate located in each of the cell region and the outer peripheral region,
wherein the first hole reaches each of the source region and the body region,
wherein the second hole reaches the gate electrode,
wherein the third hole reaches the first contact portion,
wherein the fourth hole reaches the second contact portion,
wherein the source electrode is embedded in each of the first hole, the third hole and the fourth hole, and electrically connected with each of the source region, the body region, the first field plate electrode and the second field plate electrode,
wherein the gate wiring is embedded in the second hole, and electrically connected with the gate electrode, and
wherein none of the source electrode, the gate wiring and the drain electrode are electrically connected with the first floating region.

Additional Statement 3

The method according to the additional statement 1, wherein the source electrode and the gate wiring are formed so as not to overlap the first floating region.

Additional Statement 4

The method according to the additional statement 1,
wherein, in the step of (h), a second floating region of the second conductivity type is formed in the semiconductor substrate located in the outer peripheral region,
wherein a depth of the second floating region is shallower than the depth of each of the first trench and the second trench, and
wherein the second floating region is located between the first floating region and the body region such that the second floating region is spaced apart from each of the first floating region and the body region.

Additional Statement 5

The method according to the additional statement 4,
wherein, in the step of (f), the another portion of the first field plate electrode is selectively retracted such that a portion of the first field plate electrode, which is except for the first contact portion, is left as a dividing portion, and
wherein, in the first trench, the dividing portion is located between the gate electrode and the first insulating film.

What is claimed is:
1. A semiconductor device including: a cell region in which a MOSFET is formed; and an outer peripheral region surrounding the cell region in plan view, comprising:
a semiconductor substrate of a first conductivity type, the semiconductor substrate having an upper surface and a lower surface;
a first trench extending in a first direction in plan view, and formed in each of the semiconductor substrate located in the cell region and the semiconductor substrate located in the outer peripheral region;
a first field plate electrode formed inside the first trench at a lower portion of the first trench, in each of the cell region and the outer peripheral region;
a gate electrode formed inside the first trench at an upper portion of the first trench, in each of the cell region and a first portion of the outer peripheral region;
a second trench extending in each of the first direction and a second direction perpendicular to the first direction in plan view so as to surround the cell region in plan view, and formed in the semiconductor substrate located in the outer peripheral region;
a body region of a second conductivity type opposite the first conductivity type, the body region being formed in each of the semiconductor substrate located in the cell region and the semiconductor substrate located in a second portion of the outer peripheral region;
a source region of the first conductivity type, the source region being formed in the body region located in the cell region; and
a first floating region of the second conductivity type, the first floating region being formed in the semiconductor substrate located in the outer peripheral region,
wherein a depth of each of the body region and the first floating region is shallower than a depth of each of the first trench and the second trench,
wherein the first floating region is located between the first trench located in the outer peripheral region and the second trench extending in the second direction such that the first floating region is spaced apart from the body region,
wherein, in a third portion of the outer peripheral portion, a first floating gate electrode is formed inside the first trench at the upper portion of the first trench,
wherein a second field plate electrode is formed inside the second trench at a lower portion of the second trench,
wherein a second floating gate electrode is formed inside the second trench at an upper portion of the second trench,
wherein, in the first trench, the gate electrode, the first field plate electrode and the first floating gate electrode are insulated from one another, and
wherein, in the second trench, the second field plate electrode and the second floating gate electrode are insulated from each other.

2. The semiconductor device according to claim 1,
wherein a gate potential is to be supplied to the gate electrode,
wherein a source potential is to be supplied to each of the source region, the body region, the first field plate electrode and the second field plate electrode,
wherein a drain potential is to be supplied to the semiconductor substrate, and
wherein none of the gate potential, the source potential and the drain potential are to be supplied to each of the first floating region, the first floating gate electrode and the second floating gate electrode.

3. The semiconductor device according to claim 2, further comprising:
an interlayer insulating film formed on the upper surface of the semiconductor substrate located in each of the cell region and the outer peripheral region so as to cover each of the first trench and the second trench;
a source electrode formed on the interlayer insulating film;
a gate wiring formed on the interlayer insulating film so as to surround the source electrode in plan view; and
a drain electrode formed on the lower surface of the semiconductor substrate located in each of the cell region and the outer peripheral region,
wherein a portion of the first field plate electrode located in the cell region is formed not only at the lower portion of the first trench, but also the upper portion of the first trench, and composes a first contact portion of the first field plate electrode,
wherein a portion of the second field plate electrode is formed not only at the lower portion of the second trench, but also the upper portion of the second trench, and composes a second contact portion of the second field plate electrode,
wherein, in the interlayer insulating film, a first hole reaching each of the source region and the body region, a second hole reaching the gate electrode, a third hole reaching the first contact portion, and a fourth hole reaching the second contact portion are formed,
wherein the source electrode is embedded in each of the first hole, the third hole and the fourth hole, and electrically connected with each of the source region, the body region, the first field plate electrode and the second field plate electrode, and
wherein the gate wiring is embedded in the second hole, and electrically connected with the gate electrode.

4. The semiconductor device according to claim 3, wherein the source electrode and the gate wiring are formed so as not to overlap the first floating region.

5. The semiconductor device according to claim 1, further comprising:
a second floating region of the second conductivity type, the second floating region being formed in the semiconductor substrate located in the outer peripheral region,
wherein a depth of the second floating region is shallower than the depth of each of the first trench and the second trench, and
wherein the second floating region is located between the first floating region and the body region such that the second floating region is spaced apart from each of the first floating region and the body region.

6. The semiconductor device according to claim 1,
wherein a portion of the first field plate electrode located in the outer peripheral region is formed not only at the lower portion of the first trench, but also the upper portion of the first trench, and composes a dividing portion, and
wherein, in the first trench, the dividing portion is located between the gate electrode and the first floating gate electrode.

7. A method of manufacturing a semiconductor device including: a cell region in which a MOSFET is formed; and an outer peripheral region surrounding the cell region in plan view, comprising steps of:
(a) providing a semiconductor substrate of a first conductivity type, the semiconductor substrate having an upper surface and a lower surface;
(b) after the step of (a), forming a first trench in each of the semiconductor substrate located in the cell region and the semiconductor substrate located in the outer peripheral region, and forming a second trench in the semiconductor substrate located in the outer peripheral region, the first trench extending in a first direction in plan view, and the second trench extending in each of the first direction and a second direction perpendicular to the first direction in plan view so as to surround the cell region in plan view;
(c) after the step of (b), forming a first field plate electrode such that an inside of the first trench is embedded with the first filed plate electrode, and forming a second field plate electrode such that an inside of the second trench is embedded with the second filed plate electrode;
(d) after the step of (c), selectively retracting an another portion of the first field plate electrode such that a one portion of the first field plate electrode is left as a first contact portion, and selectively retracting an another portion of the second field plate electrode such that a one portion of the second field plate electrode is left as a second contact portion;
(e) after the step of (d), forming a gate electrode on the first field plate electrode located in each of the cell region and a first portion of the outer peripheral region such that the inside of the first trench is embedded with the gate electrode, forming a first floating gate electrode on the first field plate electrode located in a third portion of the outer peripheral region such that the inside of the first trench is embedded with the first floating gate electrode, and forming a second floating gate electrode on the second field plate electrode such that the inside of the second trench is embedded with the second floating gate electrode;
(f) after the step of (e), forming a body region in each of the semiconductor substrate located in the cell region and the semiconductor substrate located in a second portion of the outer peripheral region, and forming a first floating region in the semiconductor substrate located in the outer peripheral region, the body region being a region of a second conductivity type opposite the first conductivity type, the first floating region being a region of the second conductivity type; and
(g) after the step of (f), forming a source region in the body region located in the cell region, the source region being a region of the first conductivity type,
wherein a depth of each of the body region and the first floating region is shallower than a depth of each of the first trench and the second trench,
wherein the first floating region is located between the first trench located in the outer peripheral region and the second trench extending in the second direction such that the first floating region is spaced apart from the body region, wherein, in the first trench, the gate electrode, the first field plate electrode and the first floating gate electrode are insulated from one another, and wherein, in the second trench, the second field plate electrode and the second floating gate electrode are insulated from each other.

8. The method according to claim 7, further comprising steps of:
(h) after the step of (g), forming an interlayer insulating film on the upper surface of the semiconductor substrate located in each of the cell region and the outer peripheral region so as to cover each of the first trench and the second trench;
(i) after the step of (h), in the interlayer insulating film, forming a first hole, a second hole, a third hole and a fourth hole;
(j) after the step of (i), forming a source electrode on the interlayer insulating film, and forming a gate wiring on the interlayer insulating film so as to surround the source electrode in plan view; and
(k) after the step of (j), forming a drain electrode on the lower surface of the semiconductor substrate located in each of the cell region and the outer peripheral region,
wherein the first hole reaches each of the source region and the body region,
wherein the second hole reaches the gate electrode,
wherein the third hole reaches the first contact portion,
wherein the fourth hole reaches the second contact portion,
wherein the source electrode is embedded in each of the first hole, the third hole and the fourth hole, and electrically connected with each of the source region, the body region, the first field plate electrode and the second field plate electrode,
wherein the gate wiring is embedded in the second hole, and electrically connected with the gate electrode, and
wherein none of the source electrode, the gate wiring and the drain electrode are electrically connected with each of the first floating region, the first floating gate electrode and the second floating gate electrode.

9. The method according to claim 8, wherein the source electrode and the gate wiring are formed so as not to overlap the first floating region.

10. The method according to claim 7,
wherein, in the step of (f), a second floating region of the second conductivity type is formed in the semiconductor substrate located in the outer peripheral region,
wherein a depth of the second floating region is shallower than the depth of each of the first trench and the second trench, and
wherein the second floating region is located between the first floating region and the body region such that the second floating region is spaced apart from each of the first floating region and the body region.

11. The method according to claim 7,
wherein, in the step of (d), the another portion of the first field plate electrode is selectively retracted such that a portion of the first field plate electrode, which is except for the first contact portion, is left as a dividing portion, and
wherein, in the first trench, the dividing portion is located between the gate electrode and the first floating gate electrode.

12. A semiconductor device including: a cell region in which a MOSFET is formed; and an outer peripheral region surrounding the cell region in plan view, comprising:

a semiconductor substrate of a first conductivity type, the semiconductor substrate having an upper surface and a lower surface;
a first trench extending in a first direction in plan view, and formed in each of the semiconductor substrate located in the cell region and the semiconductor substrate located in the outer peripheral region;
a first field plate electrode formed inside the first trench at a lower portion of the first trench, in each of the cell region and the outer peripheral region;
a gate electrode formed inside the first trench at an upper portion of the first trench, in each of the cell region and a first portion of the outer peripheral region;
a second trench extending in each of the first direction and a second direction perpendicular to the first direction in plan view so as to surround the cell region in plan view, and formed in the semiconductor substrate located in the outer peripheral region;
a body region of a second conductivity type opposite the first conductivity type, the body region being formed in each of the semiconductor substrate located in the cell region and the semiconductor substrate located in a second portion of the outer peripheral region;
a source region of the first conductivity type, the source region being formed in the body region located in the cell region; and
a first floating region of the second conductivity type, the first floating region being formed in the semiconductor substrate located in the outer peripheral region,
wherein a depth of each of the body region and the first floating region is shallower than a depth of each of the first trench and the second trench,
wherein the first floating region is located between the first trench located in the outer peripheral region and the second trench extending in the second direction such that the first floating region is spaced apart from the body region,
wherein, in a third portion of the outer peripheral portion, the upper portion of the first trench is embedded with a first insulating film,
wherein a second field plate electrode is formed inside the second trench at a lower portion of the second trench,
wherein an upper portion of the second trench is embedded with a second insulating film,
wherein the semiconductor substrate, the gate electrode and the first field plate electrode are insulated from one another, and
wherein the semiconductor substrate and the second field plate electrode are insulated from each other.

13. The semiconductor device according to claim 12,
wherein a gate potential is to be supplied to the gate electrode,
wherein a source potential is to be supplied to each of the source region, the body region, the first field plate electrode and the second field plate electrode,
wherein a drain potential is to be supplied to the semiconductor substrate, and
wherein none of the gate potential, the source potential and the drain potential are to be supplied to the first floating region.

14. The semiconductor device according to claim 13, further comprising:
an interlayer insulating film formed on the upper surface of the semiconductor substrate located in each of the cell region and the outer peripheral region so as to cover each of the first trench and the second trench;

a source electrode formed on the interlayer insulating film;

a gate wiring formed on the interlayer insulating film so as to surround the source electrode in plan view; and a drain electrode formed on the lower surface of the semiconductor substrate located in each of the cell region and the outer peripheral region, wherein a portion of the first field plate electrode located in the cell region is formed not only at the lower portion of the first trench, but also the upper portion of the first trench, and composes a first contact portion of the first field plate electrode, wherein a portion of the second field plate electrode is formed not only at the lower portion of the second trench, but also the upper portion of the second trench, and composes a second contact portion of the second field plate electrode, wherein, in the interlayer insulating film, a first hole reaching each of the source region and the body region, a second hole reaching the gate electrode, a third hole reaching the first contact portion, and a fourth hole reaching the second contact portion are formed, wherein the source electrode is embedded in each of the first hole, the third hole and the fourth hole, and electrically connected with each of the source region, the body region, the first field plate electrode and the second field plate electrode, and wherein the gate wiring is embedded in the second hole, and electrically connected with the gate electrode.

15. The semiconductor device according to claim 14, wherein the source electrode and the gate wiring are formed so as not to overlap the first floating region.

16. The semiconductor device according to claim 12, further comprising:

a second floating region of the second conductivity type, the second floating region being formed in the semiconductor substrate located in the outer peripheral region, wherein a depth of the second floating region is shallower than the depth of each of the first trench and the second trench, and wherein the second floating region is located between the first floating region and the body region such that the second floating region is spaced apart from each of the first floating region and the body region.

17. The semiconductor device according to claim 12, wherein a portion of the first field plate electrode located in the outer peripheral region is formed not only at the lower portion of the first trench, but also the upper portion of the first trench, and composes a dividing portion, and wherein, in the first trench, the dividing portion is located between the gate electrode and the first insulating film.

\* \* \* \* \*